US007898159B2

(12) United States Patent
Heydt et al.

(10) Patent No.: US 7,898,159 B2
(45) Date of Patent: *Mar. 1, 2011

(54) COMPLIANT ELECTROACTIVE POLYMER TRANSDUCERS FOR SONIC APPLICATIONS

(75) Inventors: Richard P. Heydt, Palo Alto, CA (US); Ronald E. Pelrine, Louisville, CO (US); Roy D. Kornbluh, Palo Alto, CA (US); Neville A. Bonwit, Sunnyvale, CA (US); Joseph S. Eckerle, Redwood City, CA (US)

(73) Assignee: SRI International, Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/564,793

(22) Filed: Sep. 22, 2009

(65) Prior Publication Data

US 2010/0013356 A1 Jan. 21, 2010

Related U.S. Application Data

(60) Division of application No. 11/676,977, filed on Feb. 20, 2007, now Pat. No. 7,608,989, and a continuation-in-part of application No. 11/335,805, filed on Jan. 18, 2006, now Pat. No. 7,259,503, which is a continuation of application No. 10/893,730, filed on Jul. 16, 2004, now Pat. No. 7,049,732, which is a division of application No. 09/619,847, filed on Jul. 20, 2000, now Pat. No. 6,812,624.

(60) Provisional application No. 60/776,265, filed on Feb. 24, 2006, provisional application No. 60/144,556, filed on Jul. 20, 1999, provisional application No. 60/153,329, filed on Sep. 10, 1999, provisional application No. 60/161,325, filed on Oct. 25, 1999, provisional application No. 60/181,404, filed on Feb. 9, 2000, provisional application No. 60/187,809, filed on Mar. 8, 2000, provisional application No. 60/192,237, filed on Mar. 27, 2000, provisional application No. 60/184,217, filed on Feb. 23, 2000.

(51) Int. Cl.
*H01L 41/08* (2006.01)

(52) U.S. Cl. .......... 310/800; 310/317; 310/328; 310/330

(58) Field of Classification Search .................. 310/317, 310/328, 330, 800
See application file for complete search history.

(56) References Cited

U.S. PATENT DOCUMENTS 3,403,234 A 9/1968 Roswell (Continued)

FOREIGN PATENT DOCUMENTS

JP 52120840 A2 10/1977

(Continued)

OTHER PUBLICATIONS

Chen et al., "Active control of low-frequency sound radiation from vibrating panel using planar sound sources," *Journal of Vibration and Acoustics*, vol. 124, pp. 2-9, Jan. 2002.

(Continued)

*Primary Examiner* — Thomas M Dougherty

(74) *Attorney, Agent, or Firm* — John E. Mrozinski, Jr.; Noland J. Cheung

(57) ABSTRACT

Described herein are compliant electroactive polymer transducers for use in acoustic applications. A compliant electroactive polymer transducer includes a compliant electroactive polymer at least two electrodes. For sound production, circuitry in electrical communication with the transducer electrodes is configured to apply a driving signal that causes the electroactive polymer to deflect in the acoustic range.

6 Claims, 9 Drawing Sheets

U.S. PATENT DOCUMENTS

| | | | | |
|---|---|---|---|---|
| 4,342,936 | A | 8/1982 | Marcus et al. | |
| 4,400,634 | A | 8/1983 | Micheron | |
| 4,762,733 | A | 8/1988 | Thiel et al. | |
| 4,843,275 | A | 6/1989 | Radice | |
| 4,885,783 | A | 12/1989 | Whitehead et al. | |
| 4,961,956 | A | 10/1990 | Simopoulos et al. | |
| 4,969,197 | A | 11/1990 | Takaya | |
| RE33,651 | E | 7/1991 | Blonder et al. | |
| 5,149,514 | A | 9/1992 | Sanjurjo | |
| 5,156,885 | A | 10/1992 | Budd | |
| 5,171,734 | A | 12/1992 | Sanjurjo et al. | |
| 5,206,557 | A | 4/1993 | Bobbio | |
| 5,229,979 | A | 7/1993 | Scheinbeim et al. | |
| 5,258,201 | A | 11/1993 | Munn et al. | |
| 5,302,318 | A | 4/1994 | Dutta et al. | |
| 6,343,129 | B1 | 1/2002 | Pelrine et al. | |
| 6,664,718 | B2 | 12/2003 | Pelrine et al. | |
| 6,806,808 | B1 | 10/2004 | Watters et al. | |
| 6,812,624 | B1 | 11/2004 | Pei et al. | |
| 7,062,055 | B2 * | 6/2006 | Pelrine et al. | 381/191 |
| 7,521,840 | B2 | 4/2009 | Heim | |
| 7,608,989 | B2 * | 10/2009 | Heydt et al. | 310/368 |
| 2002/0013545 | A1 | 1/2002 | Soltanpour et al. | |
| 2002/0122561 | A1 | 9/2002 | Pelrine et al. | |
| 2004/0232807 | A1 | 11/2004 | Pelrine et al. | |
| 2007/0200453 | A1 | 8/2007 | Heim | |
| 2007/0200454 | A1 | 8/2007 | Smith | |
| 2007/0200457 | A1 | 8/2007 | Heim et al. | |
| 2007/0200466 | A1 | 8/2007 | Heim | |
| 2007/0200467 | A1 | 8/2007 | Heydt et al. | |

FOREIGN PATENT DOCUMENTS

| | | | |
|---|---|---|---|
| JP | 54045593 | A2 | 4/1979 |
| JP | 56101788 | A2 | 8/1981 |
| JP | 5181120 | A2 | 7/1993 |
| JP | 6199499 | A2 | 7/1994 |
| JP | 21286162 | A2 | 10/2001 |
| WO | WO 95/08905 | | 3/1995 |
| WO | WO 99/37921 | | 7/1999 |
| WO | WO 01/06575 | | 1/2001 |
| WO | WO 01/06579 | | 1/2001 |
| WO | WO 01/59852 | | 8/2001 |

OTHER PUBLICATIONS

Heydt et al., "Acoustical performance of an electrostrictive polymer film loudspeaker," *Journal of the Acoustical Society of America*, vol. 107 (2), Feb. 2000.

International Search Report dated Mar. 11, 2008 in PCT Application No. PCT/US07/04602.

Khuri-Yakub et al., "Silicon micromachined ultrasonic transducers," *Japan Journal of Applied Physics*, vol. 39 (2000), pp. 2883-2887, Par 1, No. 5B, May 2000.

Kinsler et al., Fundamentals of Acoustics, Third Edition, John Wiley and Sons, 1982.

NXT plc, Huntingdon, UK (www.nxtsound.com).

Office Action dated Apr. 1, 2008 in Japanese Application No. 10-534911.

Pelrine, R. et al., "High-speed electrically actuated elastomers with strain greater than 100%," *Science*, vol. 287, pp. 836-839, Feb. 4, 2000.

Suzuki et al., "Sound radiation from convex and concave domes in infinite baffle,"*Journal of the Acoustical Society of America*, vol. 69 (2), Jan. 1981.

Woodard, Improvements of ModalMax High-Fidelity Piezoelectric Audio Device (LAR-16321-1), NASA Tech Briefs, p. 36, May 2005.

Written Opinion dated Mar. 11, 2008 in PCT Application No. PCT/US07/04602.

U.S. Appl. No. 11/676,977 filed Feb. 20, 2007 in the name of Heydt et al., Ex Parte Office Action mailed Jan. 29, 2009.

U.S. Appl. No. 11/676,977, filed Feb. 20, 2007 in the name of Heydt et al., Notice of Allowance mailed Jun. 16, 2009.

* cited by examiner

COMPLIANT ELECTROACTIVE POLYMER TRANSDUCERS FOR SONIC APPLICATIONS

CROSS-REFERENCE TO RELATED APPLICATIONS

This application is a divisional of U.S. patent application Ser. No. 11/676,977 filed on Feb. 20, 2007 which claims benefit of priority from U.S. Provisional Patent Application No. 60/776,265 filed on Feb. 24, 2006 and is continuation-in-part of U.S. application Ser. No. 11/335,805 filed on Jan. 18, 2006, now U.S. Pat. No. 7,259,503, which is a continuation of U.S. patent application Ser. No. 10/893,730 filed on Jul. 16, 2004, now U.S. Pat. No. 7,049,732, which is a divisional of 09/619,847 filed on Jul. 20, 2000, now U.S. Pat. No. 6,812, 624, which claims benefit of priority from: U.S. Provisional Patent Application No. 60/144,556 filed on Jul. 20, 1999; U.S. Provisional Patent Application No. 60/153,329 filed on Sep. 10, 1999; U.S. Provisional Patent Application No. 60/161, 325 filed on Oct. 25, 1999; U.S. Provisional Patent Application No. 60/181,404 filed on Feb. 9, 2000; U.S. Provisional Patent Application No. 60/187,809 filed on Mar. 8, 2000; U.S. Provisional Patent Application No. 60/192,237 filed on Mar. 27, 2000; and U.S. Provisional Patent Application No. 60/184,217 filed on Feb. 23, 2000; all of these provisional patent applications, patent applications, and patents are incorporated by reference in their entirety for all purposes.

STATEMENT REGARDING FEDERALLY SPONSORED RESEARCH OR DEVELOPMENT

This application was made in part with government support under contract number N66001-97-C-8611 awarded by the Office of Naval Research. The government has certain rights in the invention.

FIELD OF THE INVENTION

The present invention relates to compliant electroactive polymers. In particular, the invention relates to compliant electroactive polymers used in sonic applications such as sound production and noise cancellation.

BACKGROUND OF THE INVENTION

Acoustic actuators most commonly act as point sources for producing sound, i.e., are used as speakers, but are also used for active noise and vibration control. The most common of these acoustic actuators or speakers are electromagnetic-based and electrostatic-based systems.

Electromagnetic actuators include permanent magnets and copper coils which can be relatively heavy and have relatively high profiles, even for low-power applications. The higher the spatial resolution desired from a speaker, the greater the number of electromagnetic actuators required. Accordingly, for applications requiring high spatial resolution but with weight and space limitations, such as in automotive and aerospace applications, electromagnetic acoustic actuators are impractical.

Electrostatic speakers are constructed with two electrode plates having different electrical potentials and positioned with a narrow air gap in between, with air being used as the dielectric medium. To produce sound, one of the plates is held stationary and the other is moved relative to the stationary plate. The movable plate is electrostatically attracted to the stationary plate. While electrostatic speakers are lightweight and can be made to have a relatively low profile, they have several disadvantages for many applications. These speakers tend to be costly since it is necessary to carefully construct the speaker so that the moving plate does not contact the stationary plate, but with a small enough air gap so that the driving voltage is not required to be excessive. Additionally, because the radiating plate must maintain a nearly constant spacing from a rigid stationary plate, these speakers are limited to flat-mounted applications. Further, as electrostatic speakers typically operate with a bias voltage of several thousand volts, limitations on the driving voltage will also limit the acoustic power output.

Speakers using piezoelectric ceramics and relatively rigid polymer materials as the dielectric layer are also known. With these speakers, sound is produced primarily by changing the thickness of the polymer film (or stack of films) due to the electrostrictive or piezoelectric effect. The polymer dielectric allows greater power output (per speaker surface area and weight) than air-gap-based electrostatic speakers at a given voltage. As the electrostatic energy is multiplied by the dielectric constant of the polymer, the polymer dielectric has a greater breakdown voltage than air in practical designs. Thus, since the applied voltage can be greater than that generated by air-gap devices, the electric field will also be greater, further increasing the power output capabilities of the actuator.

U.S. Pat. No. 6,343,129 discloses speakers using electroactive polymers having low moduli of elasticity in which the in-plane strains of the compliant electroactive polymer dielectric are used to induce out-of-plane deflection of die film to produce sound. The stiffness and mass of polymer films operating in this out-of-plane configuration are orders of magnitude less than that for compression of the more rigid polymers used in the electrostrictive and piezoelectric devices mentioned above. This allows for higher acoustic output per surface area and per weight at lower driving voltages than is possible with other electrostatic devices. Other advantages of speakers made with elastomeric polymer films is that they can be made in a wide variety of form factors, i.e., they can be conformed to any shape or surface, they are very lightweight and have very low-profiles that can be unobtrusively located on walls, ceilings or other surfaces, and they are relatively easy to manufacture and use low cost materials.

With the advantages provided to electrostatic speakers by use of dielectrics made of compliant electroactive polymer films, there is great interest in the improvement of speaker performance as well as other acoustic applications, such as active noise and vibration control systems, and non-acoustic applications, such as the control of airflow and turbulence on the surface of aircraft, ships, or other objects.

BRIEF SUMMARY OF THE INVENTION

The present invention relates to the use of compliant electroactive polymer transducers in acoustic applications. A compliant electroactive polymer transducer includes a compliant electroactive polymer with at least two electrodes. For sound production, circuitry in electrical communication with the transducer electrodes is configured to apply a driving signal that causes the electroactive polymer to deflect in the acoustic range.

In one aspect, the present invention relates to a sonic device. The sonic device includes an electroactive polymer transducer and a circuit. The electroactive polymer transducer includes a portion of an electroactive polymer and a first electrode in contact with the portion and a second electrode in contact with the portion. The electroactive polymer transducer is arranged in a manner which causes the portion to deflect in response to a change in electric field that is applied via at least one of the first electrode and the second electrode. The electroactive polymer has an elastic modulus less than about 100 MPa. The circuit in electrical communication with the first electrode and the second electrode and configured to provide an actuation signal to at least one of the first electrode and second electrode. The actuation signal causes the electroactive polymer transducer to deflect at a frequency less than about 50 kHz.

In another aspect, the present invention relates to a method of producing sound. The method includes providing an electroactive polymer transducer. The transducer has an electroactive polymer and a first electrode in contact with a first surface of the electroactive polymer and a second electrode in contact with a second surface of the electroactive polymer. The electroactive polymer has an elastic modulus less than about 100 MPa. The method also includes deflecting the polymer to a bias position and maintaining the polymer near the bias position. The method further includes deflecting the electroactive polymer transducer from the bias position at a frequency less than about 50 kHz.

In yet another aspect, the present invention relates to a sonic actuator. The sonic actuator includes an electroactive polymer transducer, a biasing mechanism, and a circuit. The electroactive polymer transducer includes a portion of an electroactive polymer and a first electrode in contact with the portion and a second electrode in contact with the portion. The biasing mechanism is configured to position the portion in a bias position that differs from a resting position of the portion when no external forces are applied to the electroactive polymer transducer. The circuit is in electrical communication with the first electrode and the second electrode and configured to provide an actuation signal to at least one of the first electrode and second electrode. The actuation signal causes the portion to deflect from the bias position at a frequency less than about 50 kHz.

In still another aspect, the present invention relates to a sonic actuator. The sonic actuator includes an electroactive polymer transducer, a biasing mechanism, and a circuit. The biasing mechanism is configured to position the portion in a first bias position and a second bias position that each differs from a resting position of the portion when no external forces are applied to the electroactive polymer transducer. Upon deflection, the first bias position and the second bias position include a different directivity of acoustic output.

In another aspect, the present invention relates to a sonic actuator. The sonic actuator includes an electroactive polymer transducer, a first biasing mechanism, a second biasing mechanism, and a circuit. The electroactive polymer transducer includes a first portion of an electroactive polymer and a second portion of the electroactive polymer. The first biasing mechanism is configured to position the first portion of the electroactive polymer in a first bias position that differs from a resting position of the first portion when no external forces are applied to the electroactive polymer transducer. The second biasing mechanism is configured to position the second portion in a second bias position that differs from a resting position of the second portion when no external forces are applied to the electroactive polymer transducer In yet another aspect, the present invention relates to a sonic actuator. The sonic actuator includes a first electroactive polymer transducer, a second electroactive polymer transducer, and a circuit. The first electroactive polymer transducer includes a portion of a first electroactive polymer and at least two electrodes in contact with a portion of the first electroactive polymer. The second electroactive polymer transducer includes a second electroactive polymer and at least two electrodes in contact with a portion of the second electroactive polymer. The second electroactive polymer transducer is configured to position the portion of the first electroactive polymer in a bias position that differs from a resting position of the portion of a first electroactive polymer when no external forces are applied to the electroactive polymer transducer.

These and other features, objects and advantages of the invention will become apparent to those persons skilled in the art upon reading the details of the invention as more fully described below.

BRIEF DESCRIPTION OF THE SEVERAL VIEWS OF THE DRAWINGS

The invention is best understood from the following detailed description when read in conjunction with the accompanying schematic drawings. To facilitate understanding, the same reference numerals have been used (where practical) to designate similar elements that are common to the drawings. Included in the drawings are the following:

FIG. 2A illustrates a wavelike texturing and FIG. 2B illustrates a random texturing.

DETAILED DESCRIPTION OF THE INVENTION

Before describing particular embodiments of the sonic devices, systems and applications, a discussion of compliant electroactive polymer transducers and their material properties and performance characteristics is provided, followed by a description of several suitable electroactive polymer actuators.

Electroactive Polymer Transducers

Figure 1A:
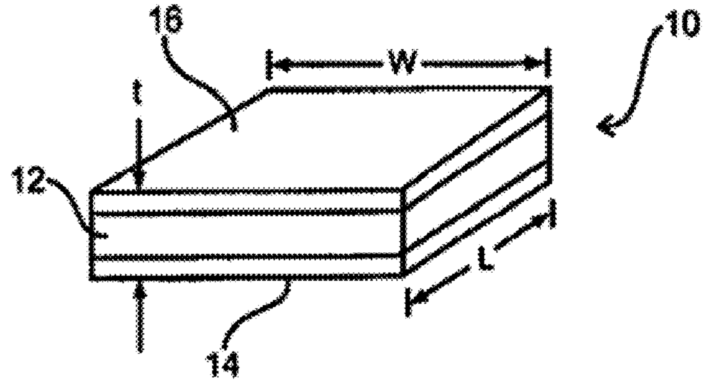
FIGS. 1A and 1B illustrate a top perspective view of a transducer before and after application of a voltage in accordance with one embodiment of the present invention.
Figure 1B:
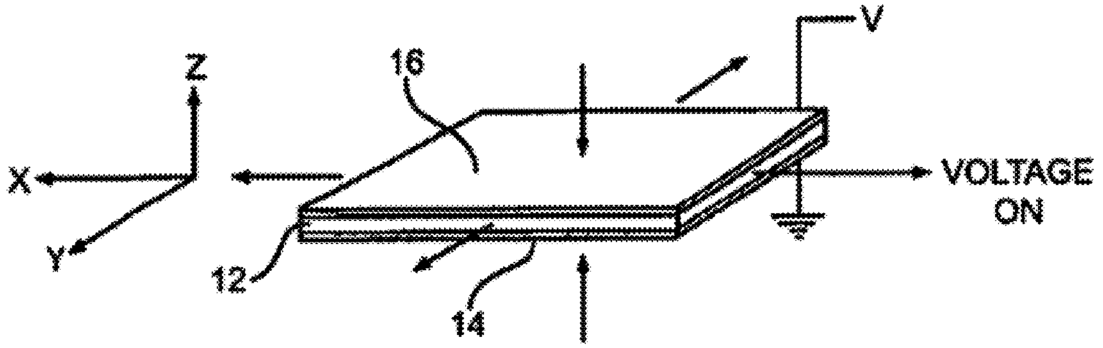

FIGS. 1A and 1B illustrate an electroactive polymer transducer 10, the basic functional element of the present invention. A portion of thin elastomeric polymer 12, also commonly referred to as a film or membrane, is sandwiched between compliant electrodes 14 and 16. In this elastomeric polymer transducer, the elastic modulus of the electrodes is generally less than that of the polymer, and the length "L" and width "W" of the film are much greater than the thickness "t".

As seen in FIG. 1B, when a voltage is applied across the electrodes, the unlike charges in the two electrodes 14, 16 are attracted to each other and these electrostatic attractive forces compress the polymer film 12 (along the Z-axis). The repulsive forces between like charges in each electrode tend to stretch the film in the plane (along the X and Y-axes). The effective actuation pressure corresponding to this electrostatic model of actuation is:

$$s = \varepsilon_r \varepsilon_o E_2 = \frac{\varepsilon_r \varepsilon_o v^2}{t^2} \qquad \text{(Equation 1)}$$

where s is the effective actuation stress or pressure on a dielectric elastomer diaphragm, $\in_r$ is the relative dielectric constant of the polymer film, $\in_o$ is the dielectric constant of free space, E is the electric field (equal to the applied voltage divided by the film thickness) and Y is Young's modulus of elasticity. This effective pressure includes the effect of both the electrostatic attractive and repulsive forces.

As transducer 10 changes in size, the deflection may be used to produce mechanical work. Generally speaking, deflection refers to any displacement, expansion, contraction, torsion, linear or area strain, or any other deformation of a portion of the transducer. Transducer 10 continues to deflect until mechanical forces balance the electrostatic forces driving the deflection. The mechanical forces include elastic restoring forces of the polymer 12 material, the compliance of the electrodes 14 and 16, and any external resistance provided by a device and/or load coupled to the transducer 10. The resultant deflection of the transducer 10 as a result of the applied voltage may also depend on a number of other factors such as the polymer 12 dielectric constant and the polymer 12 size and stiffness.

Figure 1C:
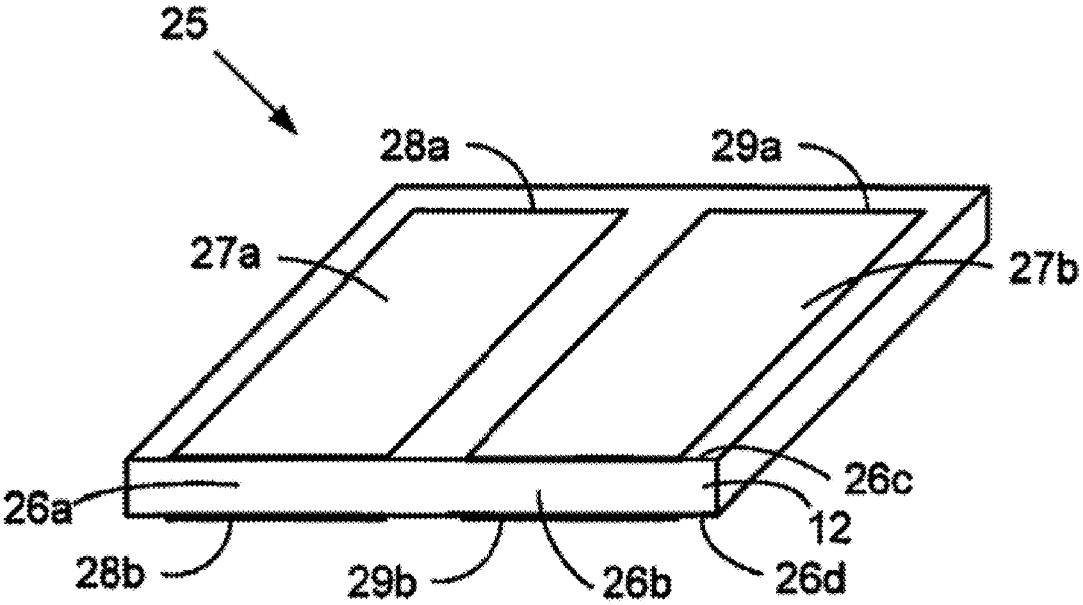
FIG. 1C illustrates an electroactive polymer transducer with multiple active areas in accordance with one embodiment of the present invention.

In some cases, electrodes 14 and 16 cover a limited portion of a polymer relative to the total area of the polymer. As the term is used herein, an active region is defined as a portion of the polymer material 12 having sufficient electrostatic force to enable deflection of the portion. FIG. 1C shows an electroactive polymer transducer 25 with multiple active areas 27*a* and 27*b*. Polymer 12 can be held using, for example, a rigid frame (not shown) attached at the edges of polymer 12.

Active area 27*a* has top and bottom electrodes 28*a* and 28*b* attached to top and bottom surfaces 26*c* and 26*d* of polymer 12, respectively. The electrodes 28*a* and 28*b* provide and/or receive a voltage difference across a portion 26*a* of polymer 12. For actuation, portion 26*a* deflects with a change in electric field provided by the electrodes 28*a* and 28*b* and comprises the polymer 26 between the electrodes 28*a* and 28*b* and any other portions of the polymer 26 having sufficient electrostatic force to enable deflection upon application of voltages using the electrodes 28*a* and 28*b*.

Polymer 12 material outside an active area may act as an external spring force on the active area during deflection. More specifically, material outside active area 27*a* may resist active area deflection by its contraction or expansion. Removal of the voltage difference and the induced charge causes the reverse effects.

Active area 27*b* comprises top and bottom electrodes 29*a* and 29*b* attached to the polymer 12 on its top and bottom surfaces 26*c* and 26*d*, respectively. The electrodes 29*a* and 29*b* provide and/or receive a voltage difference across a portion 26*b* of polymer 12. One advantage of transducer 25 is that active areas 27*a* and 27*b* may be used independently. As will be discussed below, this provides novel benefits in the context of acoustic actuation and sound emission by an electroactive polymer transducer.

Active areas for monolithic polymers and transducers of the present invention may be flexibly arranged. Further description of monolithic transducers suitable for use with the present invention is further available in U.S. Pat. No. 6,664,718, which is incorporated by reference herein for all purposes.

Polymer 12 is compliant. Suitable polymers may have an elastic modulus less than about 100 MPa, and in some cases in the range 0.1 to 10 MPa. Polymers having a maximum actuation pressure, defined as the change in force within a polymer per unit cross-sectional area between actuated and unactuated states, between about 0.05 MPa and about 10 MPa, and particularly between about 0.3 MPa and about 3 MPa are useful for many applications.

Polymer materials may be selected based on one or more material properties or performance characteristics, including but not limited to a low modulus of elasticity, a high dielectric constant, strain, energy density, actuation pressure, specific elastic energy density, electromechanical efficiency, response time, operational frequency, resistance to electrical breakdown and adverse environmental effects, etc. Polymers having dielectric constants between about 2 and about 20, and particularly between about 2.5 and about 12, are also suitable. Specific elastic energy density—defined as the energy of deformation of a unit mass of the material in the transition between actuated and unactuated states—may also be used to describe an electroactive polymer where weight is important. Polymer 12 may have a specific elastic energy density of over 3 J/g. The performance of polymer 12 may also be described by efficiency—defined as the ratio of mechanical output energy to electrical input energy. Electromechanical efficiency greater than about 80 percent is achievable with some polymers.

Linear strain and area strain may be used to describe deflection of compliant polymers used herein. As the term is used herein, linear strain refers to the deflection per unit length along a line of deflection relative to the unactuated state. Maximum linear strains (tensile or compressive) of at least about 25 percent are common for polymers of the present invention. Maximum linear strains (tensile or compressive) of at least about 50 percent are common. Of course, a polymer may deflect with a strain less than the maximum and the strain may be adjusted by adjusting the applied voltage. For some polymers, maximum linear strains in the range of about 40 to about 215 percent are common, and are more commonly at least about 100 percent. Area strain of an electroactive polymer refers to the change in planar area, e.g., the change in the plane defined by the X and Y-axes in FIG. 1B, per unit area of the polymer upon actuation relative to the unactuated state. Maximum area strains of at least about 100 percent are possible. For some polymers (at low frequencies), maximum area strains in the range of about 70 to about 330 percent are possible.

The time for a polymer to rise (or fall) to its maximum (or minimum) actuation pressure is referred to as its response time. Polymer 12 may accommodate a wide range of response times. Depending on the size and configuration of the polymer, response times may range from about 0.01 milliseconds to 1 second, for example. (h) A polymer excited at a high rate may also be characterized by an operational frequency. Maximum operational frequencies suitable may be in the range of about 100 Hz to 100 kHz. Operational frequencies in this range allow polymer 12 to be used in various acoustic applications (e.g., speakers). In some embodiments, polymer 12 may be operated at a resonant frequency to improve mechanical output.

It should be noted that desirable material properties for an electroactive polymer may vary with an actuator or application. To produce a large actuation pressure and large strain for an application, a polymer 12 may be implemented with one of a high dielectric strength, a high dielectric constant, and a low modulus of elasticity. Additionally, a polymer may include one of a high-volume resistivity and low mechanical damping for maximizing energy efficiency for an application.

There many commercially available polymer materials that may be used for polymer 12 including but not limited to: acrylic elastomer, silicone elastomer, polyurethane, PVDF copolymer and adhesive elastomer. In one embodiment, the polymer is an acrylic elastomer comprising mixtures of aliphatic acrylate that are photocured during fabrication. The elasticity of the acrylic elastomer results from a combination of the branched aliphatic groups and cross-linking between the acrylic polymer chains. One suitable material is NuSil CF 19-2186 as provided by NuSil Technology of Carpenteria, Calif. Other exemplary materials suitable for use as polymer 12 include any dielectric elastomeric polymer, silicone rubbers, fluoroelastomers, silicones such as Dow Corning HS3 as provided by Dow Corning of Wilmington, Del., fluorosilicones such as Dow Corning 730 as provided by Dow Corning of Wilmington, Del., etc, and acrylic polymers such as any acrylic in the 4900 VHB acrylic series as provided by 3M Corp. of St. Paul, Minn. Other suitable polymers may include one or more of: silicone, acrylic, polyurethane, fluorosilicone, fluoroelastomer, natural rubber, polybutadiene, nitrile rubber, isoprene, SBS, and ethylene propylene diene.

Polymer 12 may also include one or more additives to improve various properties or parameters related to the ability of the polymer to convert between mechanical energy and electrical energy. Such material properties and parameters include but are not limited to the dielectric breakdown strength, maximum strain, dielectric constant, elastic modulus, properties associated with the viscoelastic performance, properties associated with creep, response time and actuation voltage. Examples of classes of materials which may be used as additives include but are not limited to plasticizers, antioxidants, and high dielectric constant particulates.

The addition of a plasticizer may, for example, improve the functioning of a transducer by reducing the elastic modulus of the polymer and/or increasing the dielectric breakdown strength of the polymer. Examples of suitable plasticizers include high molecular-weight hydrocarbon oils, high molecular-weight hydrocarbon greases, Pentalyne H, Piccovar®. AP Hydrocarbon Resins, Admex 760, Plastolein 9720, silicone oils, silicone greases, Floral 105, silicone elastomers, nonionic surfactants, and the like. Of course, combinations of these materials may be used. Alternatively, a synthetic resin may be added to a styrene-butadiene-styrene block copolymer to improve the dielectric breakdown strength of the copolymer. For example, pentalyn-H as produced by Hercules, Inc. of Wilmington, Del. was added to Kraton D2104 as produced by Shell Chemical of Houston, Tex. to improve the dialectic breakdown strength of the Kraton D2104. Certain types of additives may be used to increase the dielectric constant of a polymer. For example, high dielectric constant particulates such as fine ceramic powders may be added to increase the dielectric constant of a commercially available polymer. Alternatively, polymers such as polyurethane may be partially fluorinated to increase the dielectric constant.

An additive may be included in a polymer to reduce the elastic modulus of the polymer. Reducing the elastic modulus enables larger strains for the polymer. In a specific embodiment, mineral oil was added to a solution of Kraton D to reduce the elastic modulus of the polymer. In this case, the ratio of mineral oil added may range from about 0 to 2:1 by weight. Specific materials included to reduce the elastic modulus of an acrylic polymer include any acrylic acids, acrylic adhesives, acrylics including flexible side groups such as isooctyl groups and 2-ethylhexyl groups, or any copolymer of acrylic acid and isooctyl acrylate.

Multiple additives may be included in a polymer to improve performance of one or more material properties. In one embodiment, mineral oil and pentalyn-H were both added to a solution of Kraton D2104 to increase the dielectric breakdown strength and to reduce the elastic modulus of the polymer. Alternatively, for a commercially available silicone rubber whose stiffness has been increased by fine particles used to increase the dielectric constant, the stiffness may be reduced by the addition of silicone grease.

An additive may also be included in a polymer to provide an additional property for the transducer. The additional property is not necessarily associated with polymer performance in converting between mechanical and electrical energy. By way of example, pentalyn-H may be added to Kraton D2104 to provide an adhesive property to the polymer. In this case, the additive also aids in conversion between mechanical and electrical energy. In a specific embodiment, polymers comprising Kraton D2104, pentalyn-H, mineral oil and fabricated using butyl acetate provided an adhesive polymer and a maximum linear strain in the range of about 70 to about 200 percent.

Polymer 12 may be prestrained to improve conversion between electrical and mechanical energy. The pre-strain improves the mechanical response of an electroactive polymer relative to a non-strained electroactive polymer. The improved mechanical response, e.g., larger deflections, faster response times, and higher actuation pressures, enables greater mechanical work.

The prestrain may comprise elastic deformation of the polymer and be formed, for example, by stretching the polymer in tension and fixing one or more of the edges to a frame while stretched or may be implemented locally for a portion of the polymer. Linear strains of at least about 200 percent and area strains of at least about 300 percent are possible with pre-strained polymers of the present invention. The pre-strain may vary in different directions of a polymer. Combining directional variability of the prestrain, different ways to constrain a polymer, scalability of electroactive polymers to both micro and macro levels, and different polymer orientations (e.g., rolling or stacking individual polymer layers) permits a broad range of actuators that convert electrical energy into mechanical work.

The desired performance of an electroactive polymer transducer may be controlled by the extent of prestrain applied to the polymer film and the type of polymer material used. For some polymers of the present invention, pre-strain in one or more directions may range from about −100 percent to about 600 percent. The pre-strain may be applied uniformly across the entire area of the polymer film or may be unequally applied in different directions. In one embodiment, pre-strain is applied uniformly over a portion of the polymer 12 to produce an isotropic pre-strained polymer. By way of example, an acrylic elastomeric polymer may be stretched by about 200 to about 400 percent in both planar directions. In another embodiment, pre-strain is applied unequally in different directions for a portion of the polymer 12 to produce an anisotropic pre-strained polymer. In this case, the polymer 12 may deflect more in one direction than another when actuated. By way of example, for a VHB acrylic elastomer having isotropic pre-strain, pre-strains of at least about 100 percent, and preferably between about 200 to about 400 percent, may be used in each direction. In one embodiment, the polymer is pre-strained by a factor in the range of about 1.5 times to about 50 times the original area. In some cases, pre-strain may be added in one direction such that a negative pre-strain occurs in another direction, e.g., 600 percent in one direction coupled with —100 percent in an orthogonal direction. In these cases, the net change in area due to the pre-strain is typically positive.

While not wishing to be bound by theory, it is believed that pre-straining a polymer in one direction may increase the stiffness of the polymer in the pre-strain direction. Correspondingly, the polymer is relatively stiffer in the high pre-strain direction and more compliant in the low pre-strain direction and, upon actuation, the majority of deflection occurs in the low pre-strain direction. In one embodiment, the transducer 10 enhances deflection along the Y-axes by exploiting large pre-strain along the X-axes. By way of example, an acrylic elastomeric polymer used as the transducer 10 may be stretched by 100 percent along the Y-axis and by 500 percent along the X-axis. Construction of the transducer 10 and geometric edge constraints may also affect directional deflection as will be described below with respect to actuators.

Pre-strain may affect other properties of the polymer. Large pre-strains may change the elastic properties of the polymer and bring it into a stiffer regime with lower viscoelastic losses. For some polymers and films, pre-strain increases the electrical breakdown strength of the polymer, which allows for higher electric fields to be used within the polymer, thereby permitting higher actuation pressures and higher deflections.

Polymers of the present invention may cover a wide range of thicknesses. In one embodiment, polymer thickness may range between about 1 micrometer and about 2 millimeters. For example, typical thicknesses before pre-strain range from about 50 to about 225 micrometers for HS3, about 25 to about 75 micrometers for NuSil CF 19-2186, and about 100 to about 1000 micrometers for any of the 3M VHB 4900 series acrylic polymers. Polymer thickness may be reduced by stretching the film in one or both planar directions. In many cases, pre-strained polymers of the present invention may be fabricated and implemented as thin films. Thicknesses suitable for these thin films may be below 20 micrometers.

Figure 2A:
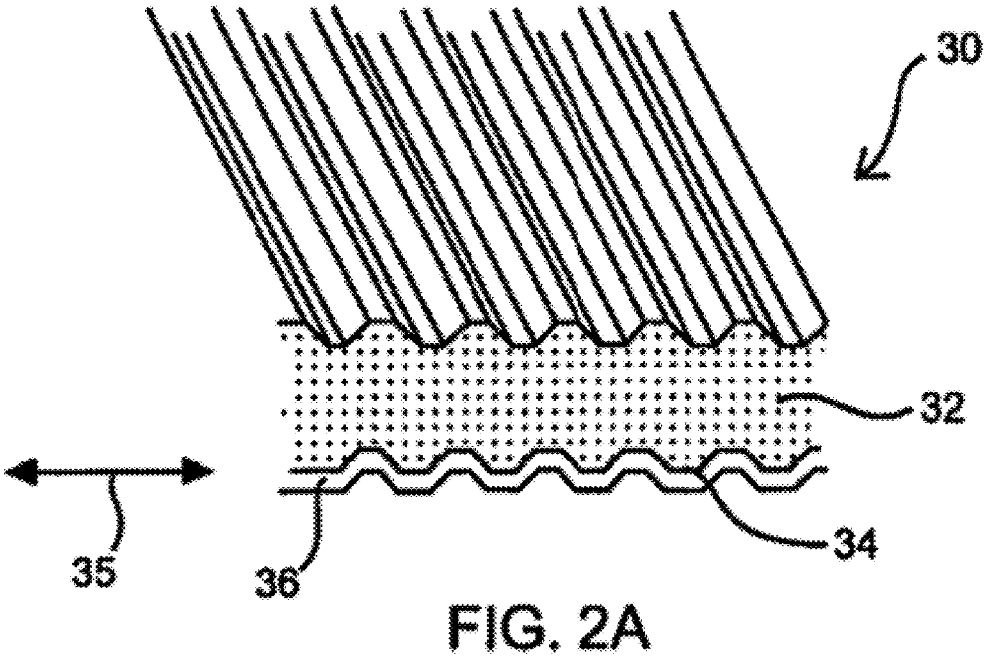
FIGS. 2A and 2B illustrate electroactive polymers having textured surfaces; in particular.

In addition to the material composition of a polymer for use in an electroactive transducer, the physical texture of the polymer surface can play a role in the performance of the transducer. Electroactive polymers in accordance with one embodiment of the present invention may include a textured surface. FIG. 2A illustrates a textured surface 30 for an electroactive polymer 32 having a wavelike profile. The textured surface 30 allows the polymer 32 to deflect using bending of surface waves 34. Bending of the surface waves 34 provides directional compliance in a direction 35 with less resistance than bulk stretching for a stiff electrode attached to the polymer 32 in the direction 35. The textured surface 30 may be characterized by troughs and crests, for example, about 0.1 micrometer to about 40 micrometers wide and about 0.1 micrometers to about 20 micrometers deep. In this case, the wave width and depth is substantially less than the thickness of the polymer. In a specific embodiment, the troughs and crests are approximately 10 micrometers wide and six micrometers deep on a polymer layer with a thickness of about 200 micrometers.

In one embodiment, a thin layer of stiff material 36, such as an electrode, is attached to the polymer 32 to provide the wavelike profile. During fabrication, the electroactive polymer is stretched more than it can stretch when actuated, and the thin layer of stiff material 36 is attached to the stretched polymer 32 surface. Subsequently, the polymer 32 is relaxed and the structure buckles to provide the textured surface.

Figure 2B:
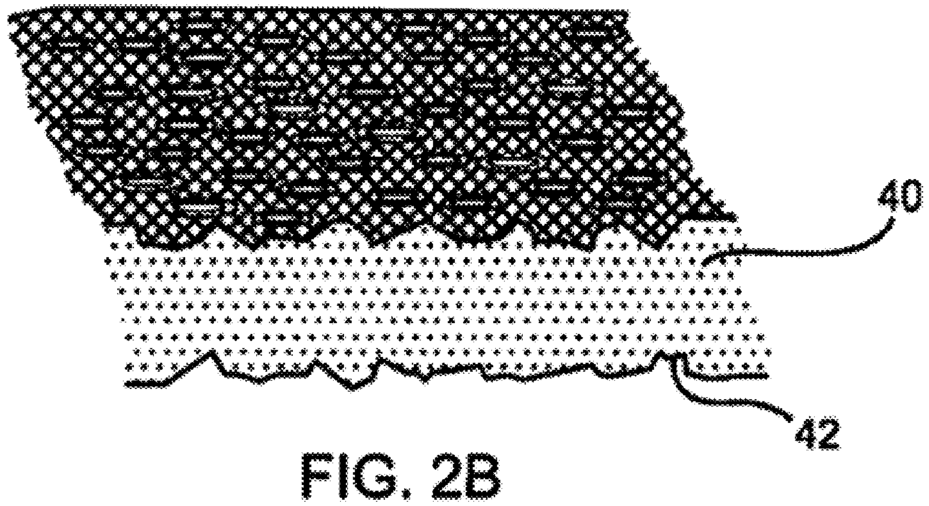

In general, a textured surface may comprise any non-uniform or non-smooth surface topography that allows a polymer to deflect using deformation in the polymer surface. By way of example, FIG. 2B illustrates an electroactive polymer 40 including a roughened surface 42 having random texturing. The roughened surface 42 allows for planar deflection that is not directionally compliant. Advantageously, deformation in surface topography may allow deflection of a stiff electrode with less resistance than bulk stretching or compression. It should be noted that deflection of a pre-strained polymer having a textured surface may comprise a combination of surface deformation and bulk stretching of the polymer.

Textured or non-uniform surfaces for the polymer may also allow the use of a barrier layer and/or electrodes that rely on deformation of the textured surfaces. The electrodes may include metals that bend according to the geometry of the polymer surface. The barrier layer may be used to block the movement of electrical charges which may prevent or delay local electrical breakdown in the polymer material.

Generally speaking, electrodes suitable for use with the present invention may be of any shape and material provided they are able to supply and/or receive a suitable voltage, either constant or varying over time, to or from an electroactive polymer. In one embodiment, the electrodes adhere to a surface of the polymer. Electrodes adhering to the polymer are preferably compliant and conform to the changing shape of the polymer. The electrodes may be only applied to a portion of an electroactive polymer and define an active area according to their geometry.

In one embodiment, compliant electrodes of the present invention comprise a conductive grease such as carbon grease or silver grease. The conductive grease provides compliance in multiple directions. Particles may be added to increase the conductivity of the polymer. By way of example, carbon particles may be combined with a polymer binder such as silicone to produce a carbon grease that has low elasticity and high conductivity. Other materials may be blended into the conductive grease to alter one or more material properties. In a specific embodiment, an electrode suitable for use with the present invention comprises 80 percent carbon grease and 20 percent carbon black in a silicone rubber binder such as Stockwell RTV60-CON as produced by Stockwell Rubber Co. Inc. of Philadelphia, Pa. The carbon grease is of the type such as NyoGel 756G as provided by Nye Lubricant Inc. of Fairhaven, Mass. The conductive grease may also be mixed with an elastomer, such as silicon elastomer RTV 118 as produced by General Electric of Waterford, N.Y., to provide a gel-like conductive grease.

Compliant electrodes of the present invention may also include colloidal suspensions. Colloidal suspensions contain submicrometer sized particles, such as graphite, silver and gold, in a liquid or elastomeric vehicle. Generally speaking, any colloidal suspension having sufficient loading of conductive particles may be used as an electrode in accordance with the present invention. In a specific embodiment, a conductive grease including colloidal sized conductive particles is mixed with a conductive silicone including colloidal sized conductive particles in a silicone binder to produce a colloidal suspension that cures to form a conductive semi-solid. An advantage of colloidal suspensions is that they may be patterned on the surface of a polymer by spraying, dip coating and other techniques that allow for a thin uniform coating of a liquid. To facilitate adhesion between the polymer and an electrode, a binder may be added to the electrode. By way of example, a water-based latex rubber or silicone may be added as a binder to a colloidal suspension including graphite.

In another embodiment, compliant electrodes are achieved using a high aspect ratio conductive material such as carbon fibrils and carbon nanotubes. These high aspect ratio carbon materials may form high surface conductivities in thin layers. High aspect ratio carbon materials may impart high conductivity to the surface of the polymer at relatively low electrode thicknesses due to the high interconnectivity of the high aspect ratio carbon materials. By way of example, thicknesses for electrodes made with common forms of carbon that are not high-aspect ratio may be in the range from about 2 to about 50 micrometers while thicknesses for electrodes made with carbon fibril or carbon nanotube electrodes may be less than about 0.5 to about 4 micrometers. Area expansions well over 100 percent in multiple directions are suitable with carbon fibril and carbon nanotube electrodes on acrylic and other polymers. High aspect ratio carbon materials may include the use of a polymer binder to increase adhesion with the electroactive polymer layer. Advantageously, the use of polymer binder allows a specific binder to be selected based on adhesion with a particular electroactive polymer layer and based on elastic and mechanical properties of the polymer.

In another embodiment, mixtures of ionically conductive materials may be used for the compliant electrodes. This may include, for example, water based polymer materials such as glycerol or salt in gelatin, iodine-doped natural rubbers and water-based emulsions to which organic salts such as potassium iodide are added. For hydrophobic electroactive polymers that may not adhere well to a water based electrode, the surface of the polymer may be pretreated by plasma etching or with a fine powder such as graphite or carbon black to increase adherence.

In some cases, a transducer of the present invention may implement two different types of electrodes. By way of example, a diaphragm actuator of the present invention may have a structured electrode attached to its top surface and a high aspect ratio carbon material deposited on the bottom side.

Generally speaking, desirable properties of the compliant electrodes may include: a low modulus of elasticity, low mechanical damping, a low surface resistivity, uniform resistivity, chemical and environmental stability, chemical compatibility with the electroactive polymer, good adherence to the electroactive polymer, and an ability to form smooth surfaces.

It is understood that certain electrode materials may work well with particular polymers and may not work as well for others. By way of example, carbon fibrils work well with acrylic elastomer polymers while not as well with silicone polymers.

In some cases, it may be desirable for the electrode material to be suitable for precise patterning during fabrication. By way of example, the compliant electrode may be spray coated onto the polymer. In this case, material properties which benefit spray coating would be desirable.

Electroactive polymers may convert between electrical energy and mechanical energy in a bidirectional manner. Thus, transducers described herein may be used in a sonic actuator that coverts electrical energy to mechanical energy and/or a generator that converts mechanical energy to electrical energy.

FIGS. 1A and 1B may be used to show one manner in which the transducer portion 10 converts mechanical energy to electrical energy. For example, if the transducer portion 10 is mechanically stretched by external forces to a thinner, larger area shape such as that shown in FIG. 1B, and a relatively small voltage difference (less than that necessary to actuate the film to the configuration in FIG. 1B) is applied between electrodes 14 and 16, the transducer portion 10 will contract in area between the electrodes to a shape such as in FIG. 1A when the external forces are removed. Stretching the transducer refers to deflecting the transducer from its original resting position—typically to result in a larger net area between the electrodes, e.g. in the plane between the electrodes. The resting position refers to the position of the transducer portion 10 having no external electrical or mechanical input and may comprise any pre-strain in the polymer. Once the transducer portion 10 is stretched, the relatively small voltage difference is provided such that the resulting electrostatic forces are insufficient to balance the elastic restoring forces of the stretch. The transducer portion 10 therefore contracts, and it becomes thicker and has a smaller planar area (orthogonal to the thickness between electrodes). When polymer 12 becomes thicker, it separates electrodes 14 and 16 and their corresponding unlike charges, thus raising the electrical energy and voltage of the charge. Further, when electrodes 14 and 16 contract to a smaller area, like charges within each electrode compress, also raising the electrical energy and voltage of the charge. Thus, with different charges on electrodes 14 and 16, contraction from a shape such as that shown in FIG. 1B to one such as that shown in FIG. 1A raises the electrical energy of the charge. That is, mechanical deflection is being turned into electrical energy and the transducer portion 10 is acting as a generator.

For a transducer having a substantially constant thickness, one mechanism for differentiating the performance of the transducer, or a portion of the transducer associated with a single active area, as performing in actuator or generator mode, is in the change in net area orthogonal to the thickness associated with the polymer deflection. For these transducers, or active areas, when the deflection causes the net area of the transducer/active area to decrease and there is charge on the electrodes, the transducer/active area is converting from mechanical to electrical energy and acting as a generator. Conversely, when the deflection causes the net area of the transducer/active area to increase and charge is on the electrodes, the transducer/active area is converting electrical to mechanical energy and acting as an actuator. The change in area in both cases corresponds to a reverse change in film thickness, i.e. the thickness contracts when the planar area expands, and the thickness expands when the planar area contracts. Both the change in area and change in thickness determine the amount of energy that is converted between electrical and mechanical. Since the effects due to a change in area and corresponding change in thickness are typically complementary, only the change in area is discussed herein for sake of brevity. In addition, although deflection of an electroactive polymer is primarily discussed herein as a net increase in area of the polymer when the polymer is being used in an actuator to produce mechanical energy, it is understood that in some cases (i.e. depending on the loading), the net area may decrease to produce mechanical work.

Devices

Deflection of an electroactive polymer according to the present invention may include bending, axial deflection, linear expansion or compression in one or more directions, deflection out of a hole provided in a substrate, etc. The transducer deflection may be translated to a desired output function or motion based at least in part on the manner and object to which the transducer is mounted. This section describes several suitable devices that incorporate an electroactive polymer transducer. Other suitable electroactive polymer devices are described in U.S. Pat. No. 6,812,624, which was incorporated by reference above.

Diaphragm actuators are made by extending an electroactive polymer over an opening in a rigid frame or structure; the film deflects radially out of the plane. As such, diaphragm actuators can displace volume, making them suitable for use in sonic applications. An example of a diaphragm actuator is described with respect to FIGS. 3A and 3B.

Figure 3A:
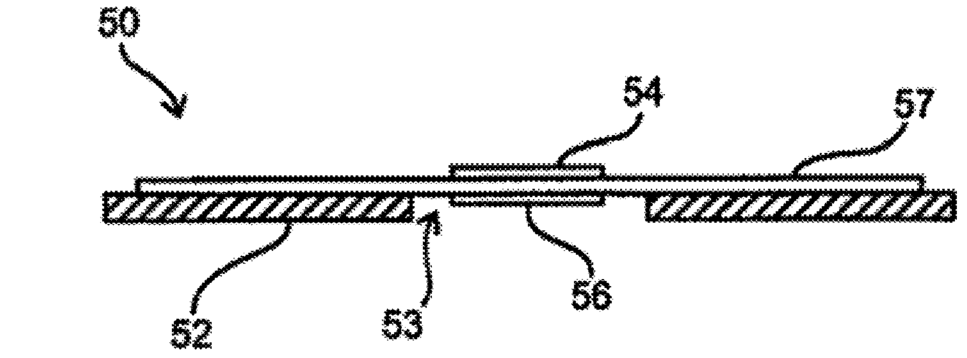
FIGS. 3A and 3B illustrate cross-sectional side views of a diaphragm transducer of the present invention before and after, respectively, application of a voltage.
Figure 3B:
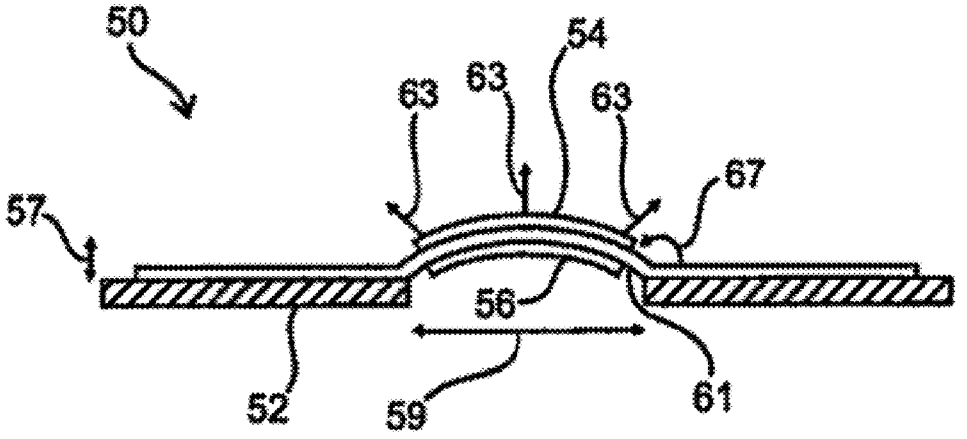

FIG. 3A illustrates a cross-sectional side view of a diaphragm device 50 including a pre-strained polymer 57 before electrical actuation in accordance with one embodiment of the present invention. The pre-strained polymer 57 is attached to a frame 52. Frame 52 includes an aperture 53 that allows deflection of the polymer 57 perpendicular to the area of the aperture 53. The aperture 53 may be a rectangular slot, a circular hole or other custom geometry aperture, etc. In some cases, an elongated slot may be advantageous for a diaphragm device compared to a circular hole. For example, thickness strain is more uniform for an elongated slot compared to a hole. Non-uniform strains limit overall performance since the electrical breakdown of a polymer is typically determined by the thinnest point. The diaphragm device 50 includes electrodes 54 and 56 on either side of the polymer 57 to provide a voltage difference across a portion of the polymer 57. Upon application of a suitable voltage to the electrodes 54 and 56 and when biased Out of plane by a suitable biasing mechanism (described below), the polymer film 57 expands away from the plane of the frame 52 as illustrated in FIG. 3B. The electrodes 54 and 56 are compliant and change shape with the pre-strained polymer 57 as it deflects.

Diaphragm device 50 may be designed to move out-of-plane both above and below the plane of frame 52. Alternatively, device 50 may be designed such that polymer 57 only moves above or below the plane of frame 52. This may be accomplished by biasing the diaphragm. Specifically, biasing, i.e., pushing, pulling, forcing or weighting the polymer in a selected direction by an external force (i.e. a force other than the intrinsic elastic restoring force of polymer 57), has been found to ensure that the diaphragm will deflect (electrode activation/thickness contraction) in a predictable direction. For example, if the bias is a pushing force, the diaphragm will deflect on the side of frame 52 away from the bias.

The biasing creates a new resting position, or bias position, for the polymer from which it deflects. The bias position differs from the original resting position of the portion when no external forces are applied to the electroactive polymer transducer or electroactive polymer device. The external forces refer to forces that are external to the polymer and device that hold or re-position the polymer but not part of the device itself (e.g. an elastic frame that holds the polymer in pre-strain). The external forces refer also do not include air pressure. Another way to view the bias position is that it changes the intrinsic elastic forces of the electroactive polymer. For example, the position of polymer 57 in FIG. 3B may refer to a bias position. In this case, the polymer 57 included a planar shape when the biasing mechanism does not position the portion in the bias position, but includes a non-planar shape when the biasing mechanism positions the portion in the bias position. For sonic applications, actuation of the polymer about the bias position may include deflections outward (when actuated) as shown by arrows 63, and back inward (elastic contractions), at the frequency of the driving signal.

In general, a biasing mechanism includes any device or system that is configured to position a portion of an electroactive polymer in a bias position. In one embodiment, biasing mechanism applies the bias forces against a side of the polymer opposite to the sound radiation surface, e.g., the bottom side 61 of polymer 57 in FIG. 3B. A variety of biasing mechanisms are suitable for use herein.

For example, the biasing mechanism may include a spring that couples to a portion of the polymer to achieve the bias position. The spring may include a compression or extension spring, a coil (cylindrical, die, conical, beehive), disc (wave, curved, Belleville), torsion, leaf, constant-force coil, air (similar to a pneumatic piston or shock absorber), elastomeric polymer (e.g., a cylinder of soft rubber that acts like a spring), etc. The spring may include one or more of the following materials: steel, plastic, rubber, fiberglass and/or micro- or nano-composite materials.

In another embodiment, a resilient foam is attached or coupled to a surface of the polymer; the foam contracts or expands the side it couples to, depending on the actuator design. The foam material may include a closed-cell foam with an average cell diameter that is substantially less than a diameter of the active area. The foam material may also include varying degrees of hardness (to help with nonlinear tuning, as will be described further below).

In another embodiment, a swelling agent such as a small amount of silicone oil is applied to a bottom surface to influence the expansion of the polymer in the direction of arrows 63, or to a top surface to influence the contraction of the polymer in the direction opposite to arrows 63. The swelling agent causes slight permanent deflection in one direction as determined during fabrication, e.g. by supplying a slight pressure on the bottom side when the swelling agent is applied.

Figure 5A:
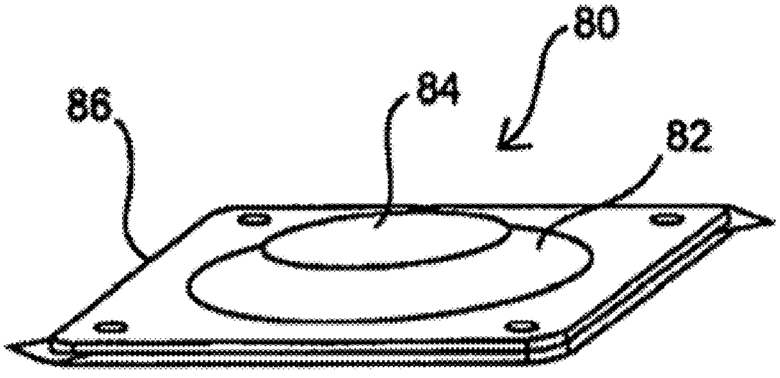
FIG. 5A is a perspective view of a frustum shaped diaphragm transducer.
Figure 5B:
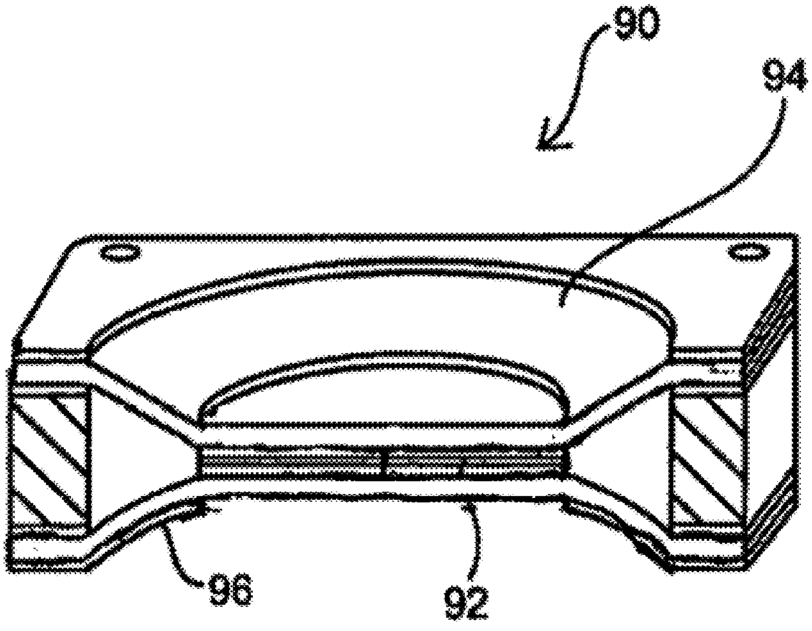
FIG. 5B is a sectional perspective view of a transducer comprised of a plurality of frustum transducers of FIG. 5A stacked in a parallel-stacked arrangement.
Figure 5C:
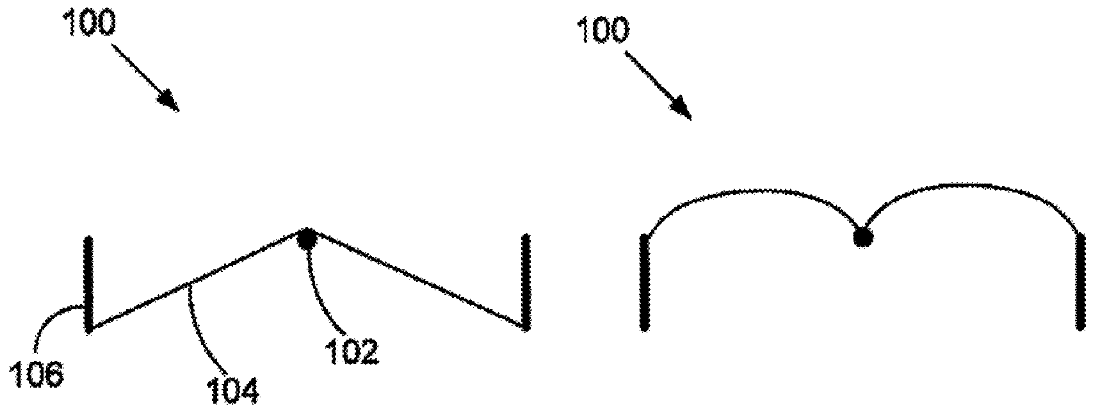
FIG. 5C shows an electroactive polymer sonic device with a fixed mechanical support attached to a middle portion of polymer in accordance with one embodiment of the present invention.

The biasing mechanism may also include one or more fixed or moveable mechanical supports that affect the bias position. FIG. 5C shows an electroactive polymer sonic device 100 with a fixed mechanical support 102 attached to a middle portion of polymer 104. Polymer 104 may be circular and held fixed around its circumference by mechanical support structure 106, or cylindrical and held fixed along its two edges. By adjusting film curvature (e.g., via air pressure or other types of bias mechanisms) appropriately, sonic device 100 changes its acoustic output directivity properties.

In one embodiment, mechanical support structure 106 can be tuned via changes in mass, geometry, material type, and/or mounting conditions to allow the sonic actuator to operate optimally for a given set of operating conditions.

Mechanical support structure 106 may also include a grid that is offset from the cartridge frame by some distance. This permits bias springs (of various types) between the electroactive polymer (cap/disc) and the grid.

Another biasing mechanism includes air pressure on one side of the polymer, as applied by an actuator or compressor. By changing the applied air pressure, the actuator or compressor also permits real time changes to the bias position. As will be described in further detail below, this has value in sonic applications where the acoustic performance of a sonic actuator varies with the shape of the radiating polymer surface and null spots in acoustic performance can be dynamically avoided in real time by altering the polymer surface.

Another real time controllable biasing mechanism includes a second electroactive polymer transducer coupled to the sound-radiating polymer. Similarly, the second electroactive polymer transducer may respond to a control signal that affects the shape of the radiating polymer. One suitable dual-polymer electroactive polymer device with two electroactive polymers is shown in FIG. 5B.

Other suitable biasing mechanisms may include a weighted mass, a rod or plunger, fluid pressure, another diaphragm or other types of external forces. Other suitable examples of biased electroactive polymers are disclosed in U.S. patent application Ser. Nos. 11/361,676; 11/361,683; 11/361,703; and 11/361,704, incorporated herein by reference in their entirety.

Regardless of the biasing mechanism, the bias influences the expansion of the polymer film 51 to repeatedly actuate in a known direction, for example upward in a direction away from the bias pressure, as shown by direction of arrows 63 (FIG. 3B). A constant bias pressure on one side of the film controls the out-of-plane actuation direction and polymer profile without diminishing the magnitude of the strains developed by the electric field.

It is possible to control the direction of out-of-plane actuation in other ways as well. For example, the diaphragm may be pre-stressed so that there is greater tensile stress toward the upper surface. The diaphragm would then tend to buckle away from this upper surface since more area expansion will occur in the region(s) of lower tensile stress. The pre-stress can be created by deflecting the diaphragm away from the upper surface before it has completely cured. A similar effect can be achieved by creating a diaphragm that is stiffer toward the bottom surface, or that has a stiffer electrode on the bottom surface, or the bottom electrode may have slightly higher prestrain than the top electrode so as to push the diaphragm upward.

Given the desire in many applications for low-profile actuators, particularly in sonic applications, the electroactive polymer may have a number of smaller curved film areas ("bubbles", where each bubble has a correspondingly smaller out-of-plane displacements rather than a single large area that moves a greater distance Out of plane. The use of smaller film areas also prevents the generation of higher-order displacement modes at the higher frequencies. In fact, the upper limit for bubble area in some applications would be determined by the minimum frequency at which these higher-order modes (which reduce the radiation efficiency of the actuator) appear. Since electroactive polymers can be easily manufactured in a variety of patterns, bubbles of different areas, each driven over a different range of frequencies, may be combined in a single actuator in order to maximize the power output for a given actuator area, while maintaining high fidelity.

Figure 4:
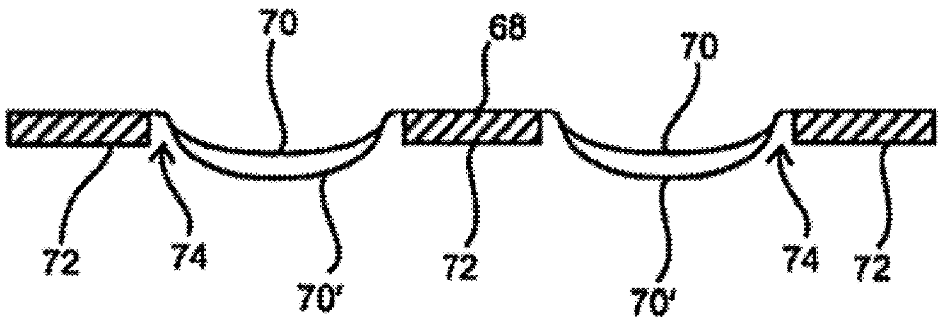
FIG. 4 illustrates the out-of-plane deflection of diaphragm transducer of the present invention in response to an applied voltage.

FIG. 4 shows a sonic device in accordance with another embodiment of the present invention in which the electroactive polymer 68, near or attached to the support structure 72, deflects from a concave bias position. Polymer 68 is supported by a support structure 72 provided with a plurality of apertures 74.

A bias pressure applied to membrane 68 causes an out-of-plane and concave protrusion of the membrane. That is, a protrusion, bulge, or "bubble" 70 is formed by a biasing force on the membrane 68 which is substantially perpendicular to the plane P of the membrane 68. The signal from the driver (not shown) can cause further movement or modulation of the bubble 70 to, for example, a position 70'. The sound-emitting surface may either be the top side (concave emission) or bottom side (convex emission) of polymer 68.

The diaphragm device of FIG. 4 may also be used as a generator. In this case, a pressure, such as air pressure from the ambient room, acts as external mechanical input to the diaphragm to deflect one or both active areas. A voltage difference is applied between the electrodes while the transducer deflects, and releasing the pressure allows the diaphragm to mechanically contract and increase the stored electrical energy on the transducer. The energy may be dissipated or stored. Such energy absorption allows devices described herein to be used in noise cancellation applications, as will be described in further detail below.

As disclosed in U.S. patent application Ser. No. 11/085,804, incorporated by reference in its entirety, stacking diaphragms in parallel is one way in which to maximize power output for out-of-plane or Z-axis input/output. Doing so amplifies the force potential of the system. The number of layers stacked may range from 2 to 100 or more.

U.S. patent application Ser. No. 11/361,703, also incorporated by reference in its entirety, discloses forming a frustum-shaped diaphragm actuator 80, as illustrated in FIG. 5A, by capping the top (or bottom) of a flat diaphragm structure. This modification alters the actuator's performance by distributing stress around the periphery of a framed diaphragm 82 that would otherwise be concentrated at its center.

In order to effect this force distribution, a weight or cap 84 is affixed to the diaphragm layers. The cap may be a solid disc, an annular member or otherwise constructed cap which may be affixed to the diaphragm 82 by means of adhesive bonding, thermal bonding, friction welding, ultrasonic welding, or the constituent pieces may be mechanically locked or clamped together. Furthermore, the capping structure may comprise a portion of the film which is made substantially more rigid through thermal, mechanical or chemical techniques—such as curing and vulcanizing.

The shape and size of the cap is selected to produce a perimeter of sufficient dimension/length to adequately distribute stress applied to the material. The ratio of the size of the cap 84 to the diameter of the frame 86 holding the Electroactive Polymer Artificial Muscle (EPAM™) layers may vary as desired; however, the larger the cap, the greater the stress/force the cap applies to the diaphragm. When diaphragm 82 is stretched in a direction perpendicular to the plane of the cap 84, as illustrated, it produces the frustum form. The degree of truncation of the structure may be selected to reduce the aggregate volume or space that the transducer occupies. Further, as taught in U.S. patent application Ser. No. 11/361,703, the mass of the cap may be set or tuned in order to provide a system that operates at resonance or within a band of frequencies near resonance, thereby delivering the desired performance at desirably high frequencies. In variable frequency applications, a system may be designed so that the peak performance range covers a broader section of frequencies, e.g. from about 0.001 to about 10,000 Hz or more. In any case, the mass of the system may be tuned so as to offer maximum displacement at a desired frequency of operation.

The frustum-shaped diaphragms can be stacked as described above to provide single-sided frustum transducers or double-sided structures. In double-sided frustum transducers, one side typically provides preload to the other. FIG. 5B illustrates a double-frustum architecture 90. Here, opposing layers 94 and 96 of EPAM™ material or one side of EPAM™ film and one side of basic elastic polymer are held together, either directly or by way of a cap, under tension along an interface section 92. To actuate the transducer for simple Z-axis motion, one of the concave/frustum sides is expanded by applying voltage while the other side is allowed to relax. Such action increases the depth of one cavity while decreasing that of the other, and visa-versa, resulting in an actuator which moves in/out or up/down relative to a neutral position. By actuating both sides in parallel, the stiffness of the system can be adjusted by means of adjusting the applied voltage.

Sonic Usage

Somewhat conflicting objectives of conventional sonic actuators are the displacement of a large volume of air and the provision of a low-profile, lightweight construction. The electroactive polymer actuators described above achieve both of these goals by using the area change developed in the diaphragm to produce out-of-plane displacement with a minimum of additional structure.

Figure 6:
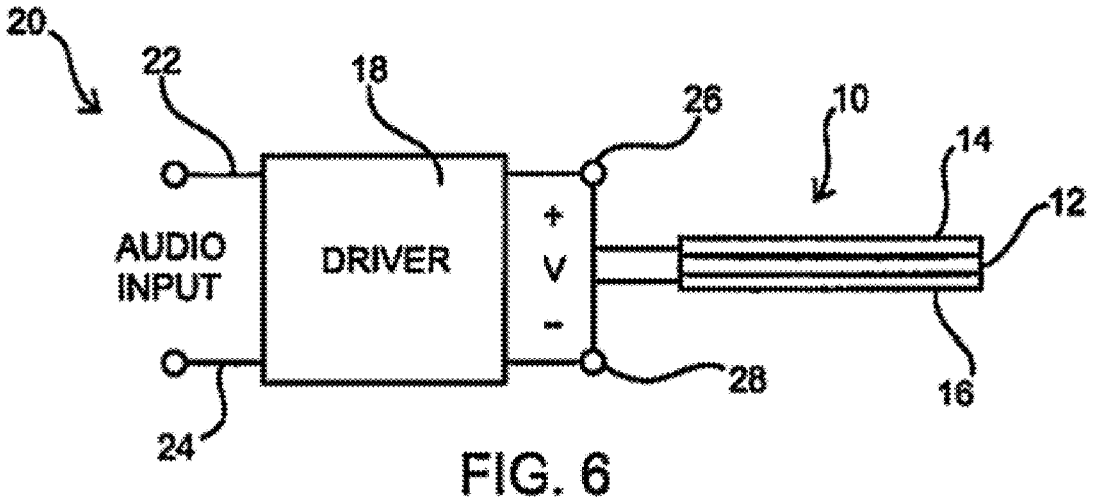
FIG. 6 is a schematic illustration of a driver circuit configured to receive an audio input signal and apply a DC voltage to a diaphragm transducer of the present invention.

Referring now to FIG. 6, a schematic diagram of an acoustic system 20 is illustrated in accordance with one embodiment of the present invention. System 20 includes a circuit, or driver, 18 having audio inputs 22, 24 and a pair of outputs 26, 28. The outputs are coupled to electrodes 14 and 16 of sonic actuator 10, the electrodes being separated by a polymer dielectric layer 12. Unlike electrostatic speakers, in which the movable electrode plate oscillates when voltage (DC+AC) is applied across the air gap between it and the stationary electrode, the voltage driving a sonic actuator 10 of the present invention is applied directly across the actuator's thickness 12.

The voltage applied to the sonic actuator 10 will depend upon the specific application. In one embodiment, an acoustic actuator of the present invention is driven electrically by modulating an applied voltage about a DC bias voltage. Modulation about a bias voltage allows for improved sensitivity and linearity of the transducer to the applied voltage. For some audio applications, the applied voltage ranges up to about 200 to 1000 volts peak-to-peak with a bias voltage ranging from about 750 to 2000 volts (DC). In one driving example, an AC voltage of 400 volts with a DC bias voltage of 2000 volts was applied to the electrodes of an air-biased, electroactive polymer diaphragm of the present invention configured as a loudspeaker. The speaker had a circular construct having a slightly convex diaphragm diameter of 10 cm. The transducer diaphragm was suspended over a plenum 2 cm deep and biased with positive air pressure.

Circuit 18 may include any combination of hardware and/or software that is configured to provide an actuation signal to the electrodes 14 and 16. In one embodiment, the actuation signal causes the electroactive polymer transducer to deflect at an acoustic frequency, e.g., less than about 20 kHz. Deflection frequencies above 20 kHz and up to 50 kHz are also permissible for some polymers. In one embodiment, the circuit 18 includes a square root driver coupled to the electrodes. The square root driver includes a summer that adds a lower power input signal to an offset voltage and a square root generator coupled to an output of the summer. A filter may also be coupled to an output of the square root generator, as well as an amplifier coupled to an output of the filter to provide a signal to drive the polymer. Circuit 18 may also be responsible for: 1) voltage step-up, which may be used when applying a voltage to the transducer 10, 2) charge control which may be used to add or to remove charge from the transducer 10 at certain times of a generation cycle, 3) voltage step-down. In noise cancellation embodiments, circuit 18 may also include electrical energy generation or dissipation circuitry.

Using dielectric elastomers as loudspeakers requires the ability to charge and discharge the electroactive polymer diaphragm at acoustic frequencies. This requirement can put more stringent demands on electrode conductivity (specifically on the RC time constant) than it does in other, lower frequency, dielectric-elastomer actuator applications. For instance, the film capacitance of the exemplary loudspeaker is about 5.6 nF. Thus, for acoustic response up to 10 kHz, the film surface resistivity should be about 5kΩ/square, or less.

$$s_{AC} = \frac{\varepsilon_r \varepsilon_o}{t^2}(2BA + A^2) \quad \text{(Equation 2)}$$

For an electroactive polymer loudspeaker diaphragm, if B is the DC voltage on the film and A is the drive or signal voltage, the time-varying actuation response, $S_{AC}$, corresponding to Equation 1 (above) is:

Assuming that radiated sound pressure is proportional to the film oscillation amplitude, the speaker response varies in proportion to the voltage term in parentheses in Equation 2, where A is the drive voltage and B is the bias voltage. When bias voltage is significantly greater than the drive voltage, i.e., B>>A, the actuation pressure and sound pressure level vary linearly with changes in the bias and drive voltages. The condition B>>A is sufficient to achieve low levels of harmonic distortion, except at low frequencies (<500 Hz). At higher drive voltages, when A is not small compared to B, it is possible to compensate for harmonic distortion.

Figure 7:
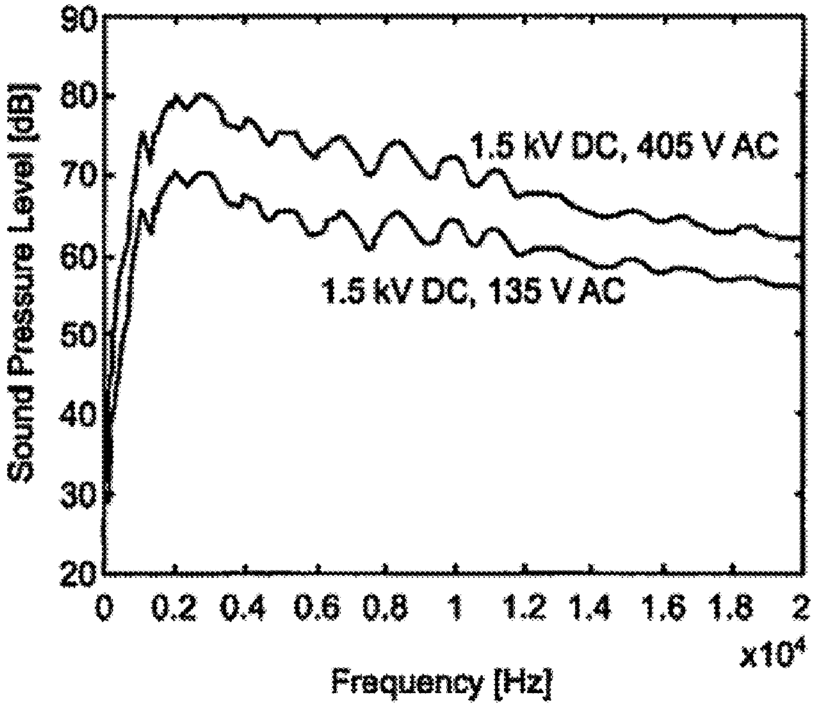
FIG. 7 is a graph of the on-axis sound pressure level (SPL) performance spectra for an electroactive polymer loudspeaker made according to the principles of the present invention.

To illustrate the effect of voltage on sound pressure level (SPL), two different drive voltages (differing by factor of 3) were applied to the exemplary loudspeaker. Specifically, drive voltages of 135 V AC and 405 V AC were each applied with a 1.5 kV bias voltage to the speaker with their respective SPL response curves illustrated in FIG. 7. The measured increase in SPL (measured at a distance of 1 meter from the speaker diaphragm surface) was in the range from about 8 dB to about 10 dB over most of the audible frequency range. These results corresponded to the predicted change in SPL based on Equation 2. Electroactive polymer acoustic actuators have distinct advantages over other types of speakers (discussed above) in that they are lightweight and can be fabricated in a wide variety of form factors, i.e., they are able to conform to any shape or surface. Electroactive polymer acoustic actuators can be flat, for example, as freestanding or wall-mounted speakers, but can also conform easily to arbitrarily curved surfaces, such as those in vehicle interiors. This distinguishes them from electrostatic loudspeakers, which are usually flat because the radiating film must maintain a nearly constant spacing from a rigid stationary electrode. These characteristics make the electroactive polymer acoustic actuators ideal for sound production applications as well as active noise control (ANC) applications, e.g. for use within the interiors of automobiles, aircraft and other vehicles to control cabin noise, or attached to vibrating machinery or structures to control radiated noise.

Notably, speaker shape affects both sound pressure level and the directivity of the sound. Convex (FIG. 3B), concave (FIG. 4), and flat (FIG. 3A) electroactive polymer acoustic actuators each have different directivity patterns. Therefore, controlling the biasing mechanism (such as air or fluid pressure behind the electroactive polymer) offers a method to provide variable directivity of the sound from the speaker.

In one embodiment, the present invention uses shape flexibility of electroactive polymer acoustic actuators to control and improve sound-radiation. By changing the mechanical bias position for an electroactive polymer, such as a diaphragm, to provide a selected radiating surface shape, the directionality of the sound output may be altered and controlled. Thus, bias position, as well as the resulting speaker shape and surface area, are parameters that may be adjusted to control SPL and sound directionality. Many of the biasing mechanisms described above provide the ability to set the bias position.

The bias position may be set during manufacture and left during implementation, or as mentioned above, or controlled in real time. In the former case, the radiating surface shape may be set to design a speaker with no nulls in the acoustic frequency range between about 0 Hz and about 20 kHz or no nulls spatially between 0 and 90 degrees from the speaker centerline.

In the real time control case, acoustic emission may be dynamically controlled to avoid nulls (or improve emission uniformity for a particular room) in real time. A control signal is then sent to the biasing mechanism to alter the bias position of the speaker. An acoustic sensor and feedback control may be added to provide closed-loop feedback control of the bias position. The dual-frustum device 90 of FIG. 5B is well suited for use as an acoustic actuator in which one polymer is used for acoustic emission, while the second polymer is used to establish a bias position of the first polymer. As mentioned above, this often results in a transducer with a greater stiffness when the sound-emitting polymer is in the bias position than without the bias.

When the two electroactive polymers are implemented in an opposing or "push-pull" arrangement, such as that shown in FIG. 5B, the nonlinear part of the voltage response of each polymer may cancel each other out provided they are supplied with similar or the same bias voltages but equal and opposite driving signals. This effectively eliminates the $A^2$ (or voltage square) term in Equation 2, which creates simpler control since the polymer acoustic response will now be linear based on A (and B, which is usually constant).

This real time control of speaker shape and corresponding acoustic output contrasts conventional speakers, where the directivity pattern at any frequency is determined by the loudspeaker size and shape, and fixed at the time of manufacture.

Figure 8:
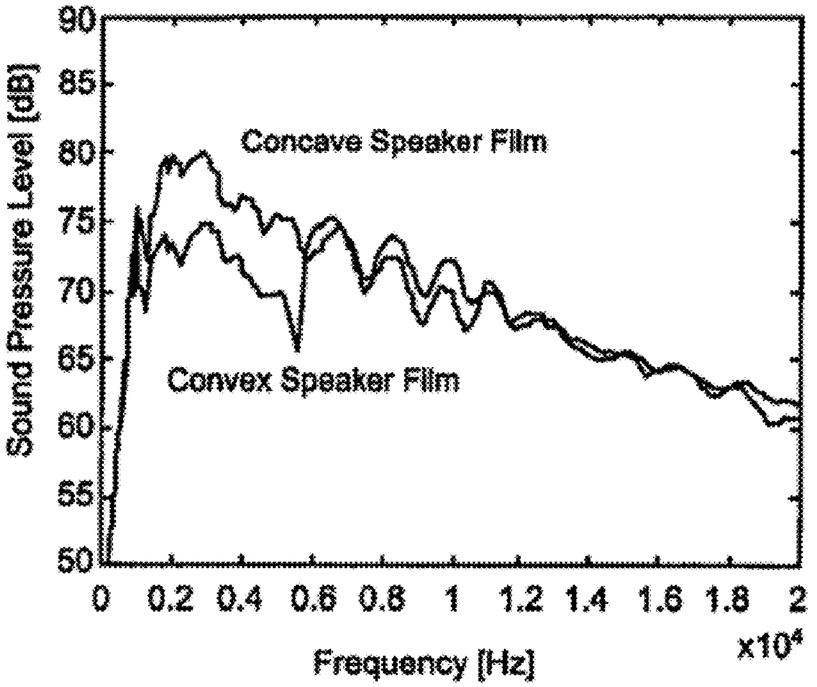
FIG. 8 is a graph of the on-axis SPL performance spectra of a mechanically biased speaker in which a comparison is made between the performance of the speaker having a concave bias and having a convex bias.

In one embodiment, the biasing mechanism changes a portion of the polymer from a convex shape to a concave shape. Again, this will affect performance of the acoustic device. To evidence such, an experiment was conducted to measure the on-axis SPL spectra for a 10-cm-diameter loudspeaker under two different mechanical-bias conditions. These biases were achieved by setting the air pressure of the plenum of the speaker so that in one case the loudspeaker film was slightly concave (negative pressure), and in the second case was slightly convex (positive pressure). With a drive voltage of 405 V AC and a bias voltage of 1.5 kV DC, SPL was measured at a distance 1 meter from the surface of the speaker diaphragm. The convex, hemispherical speaker surface has twice the surface area of a flat speaker of the same diameter, and will therefore potentially radiate more total sound power at the same voltage than a flat speaker. On the other hand, as evidenced by FIG. 8, the concave speaker produces approximately 5 dB higher SPL on-axis in the frequency range from about 1 kHz to about 6 kHz. As such, the concave loudspeaker in this example appears to be the better on-axis radiator between 1 kHz and 6 kHz. Larger dome heights produce bigger differences in on-axis SPL.

The biasing mechanism may also change shape of the polymer transducer as a function of frequency output of the speaker. For direct radiator loudspeakers, including electromagnetic (voice-coil) and electrostatic speakers, the ideal size of an acoustically radiating element of the speaker surface decreases as frequency increases. This is because sound radiation becomes more directional at higher frequency; specifically, it becomes more directional as the product ka increases, where k is wavenumber and a is the radius or characteristic dimension of the radiating surface. One way to reduce extreme directionality is to use a curved radiating surface. This is a motivation for using dome-shaped loudspeakers at mid- and high-range audio frequencies. However, with conventional (voice-coil) speakers, domes are a fixed size and are comparatively rigid—the dome material and shape are selected in part to put spatial resonances in desired frequency ranges. On the other hand, with electrostatic loudspeakers it is difficult to build the speaker surface in a domed or curved shape. Thus electrostatic loudspeakers are usually flat and sound directionality is an issue if the speaker surface area is very large. Electroactive polymer sonic devices, on the other hand, can be readily adapted to a specific shape and hence can have controlled directivity.

Bias position control also improves off-axis sound radiation. Specifically, the bias position may also be set such that the speaker radiates without a null spot into a room or space. In audio applications like home stereo systems, it is generally desirable to have isotropic sound radiation, so that there are no "dead spots" for listeners away from the speaker centerline. The same is often true for secondary sources in ANC applications, depending on the noise characteristics of the primary source. In cases in which the spatial extent of the "quiet zone" is limited—by design or by physics—it may be acceptable, or even preferable, to have non-isotropic secondary sources. In all cases it is important to know the directional characteristics of the secondary sources.

Figure 9A:
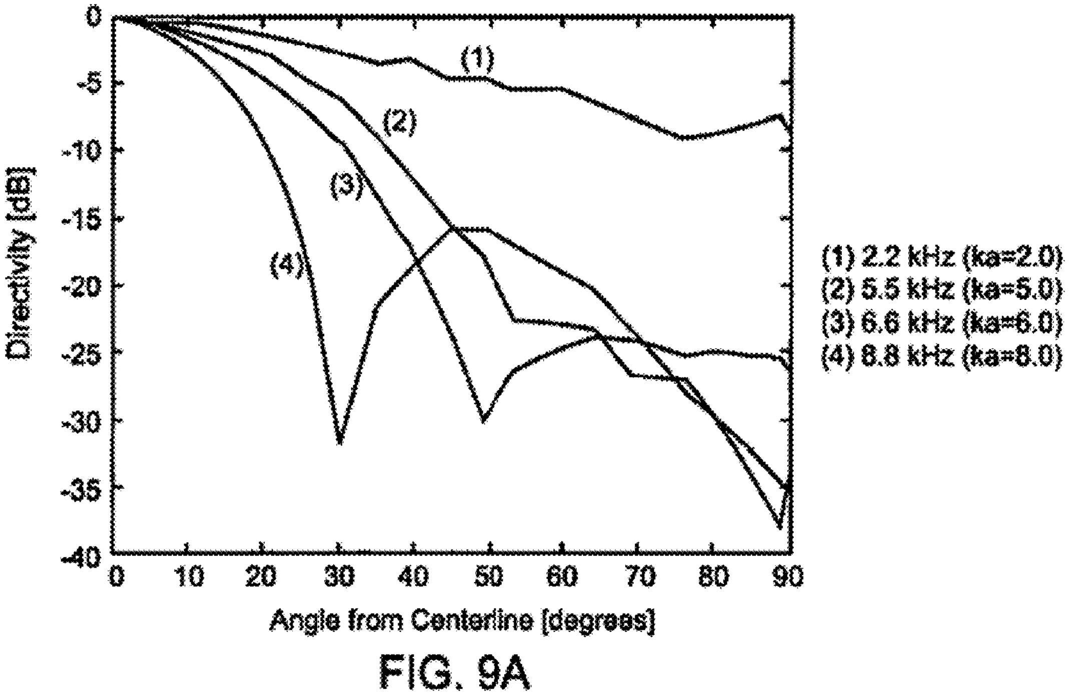
FIGS. 9A and 9B are graphs of the directivity patterns of the speaker reference in FIG. 8 when having a concave bias and a convex bias, respectively.
Figure 9B:
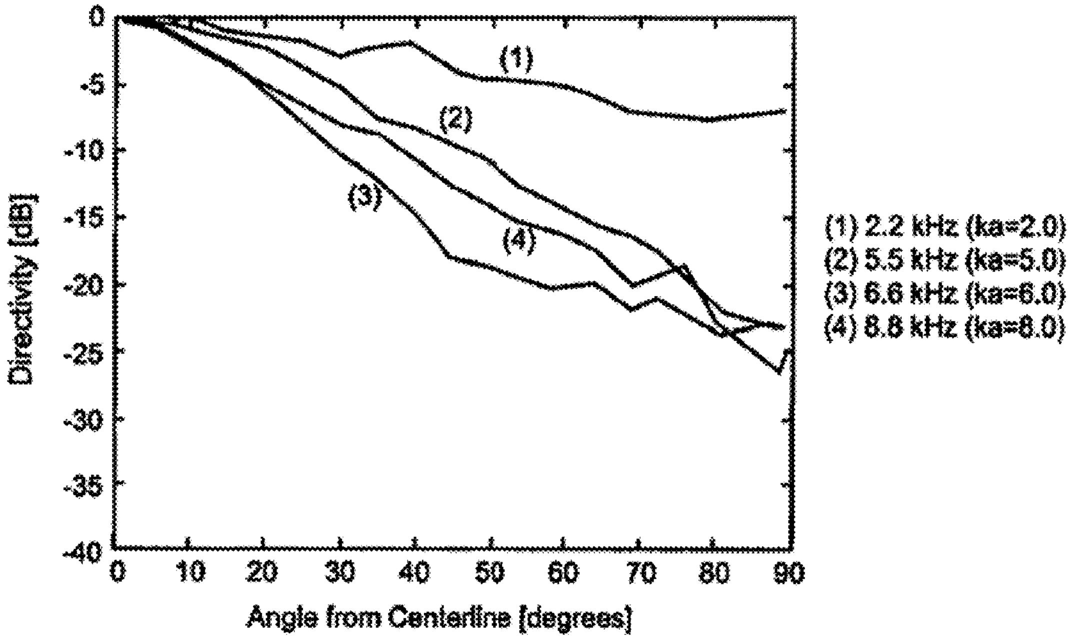

As mentioned, loudspeaker shape (as determined by the bias position) influences directivity of the speaker output. To evidence this, consider the above-referenced 10 cm speaker when in each of the positive biased (concave shape) and the negative biased (convex shape) configurations. The directivity of each configuration was measured with the audio input voltage applied at various frequencies, with the resulting measurements plotted in the graphs of FIGS. 9A and 9B with the directivity being normalized to 0 dB SPL at 0 degree at all frequencies. In the selected frequency range, FIG. 9A indicates that there are null spots within its radiation beam of the concave speaker configuration, while no such null spots are produced in the radiation beam pattern of the convex speaker configuration, as shown in FIG. 9B. These results are consistent with theoretical productions, and indicate that speaker output directivity can be controlled and optimized by selectively defining the speaker's shape (mechanical approach) with phased-array beam-forming (electrical and system design approach).

For transducers and actuators with multiple active areas (e.g., FIG. 4), each section may be biased separately to a different bias position. Thus, the speaker may include multiple biasing mechanisms, where each biasing mechanism affects one or more active areas of the polymer transducer. This permits a single speaker with multiple degrees of freedom for acoustic emission, and permits control over the segmentation and how each section is biased. By using multiple active areas, this embodiment changes the aggregate output of the speaker system. This permits a speaker where some active areas radiate more than others to avoid spatial or temporal nulls, which are determined during design.

A plurality of sonic energy devices of the present invention may be arranged in an array, for example, in an arrangement that minimizes dead spots in a surrounding environment. The array or pattern may have various shapes, such as rectilinear, hexagonal, circular, random, non-repeating, etc.

Sonic actuators described herein may also operate in multimodal regimes. In most operation instances, the polymer only deflects in its first mode of actuation, where the entire surface of the film moves in the same direction. The size of the electroactive polymer area that is actuated (e.g., in diaphragm mode) typically determines the maximum frequency for unimodal actuation. Above this frequency, the polymer will have a portion of its surface moving in a different direction. This multimodal actuation may decrease or increase the total sound output possible with the film area at a given frequency. Additionally, the amplitude of motion of the film may increase at its fundamental (unimodal) and higher-order resonances. The presence of modally influenced motion is evidenced in a frequency spectrum of the speaker by resonant peaks and resonant nulls. It is generally desired to "smooth" away these peaks and nulls to make the level of sound output more constant as a function of frequency.

Since the frequency of the resonant peaks and resonant nulls are (in part) functions of the size of the film area, sonic devices described herein may include a speaker having multiple active areas, which effectively smoothes these frequency peaks and nulls in output, since the perceived the output is a sum of the outputs of the individual active areas (at least in the far field).

The multiple active areas and multimodality may be achieved in a number of manners. As described above with respect to FIG. 1C, electrodes may be patterned on to a surface by the dozens or hundreds to create numerous active areas. The electrodes themselves may be patterned to create a great variety of active area shapes, and thereby excite a larger number of modes to achieve the smoothing. The patterning of the active film areas can be done using many techniques such as printing, masking, and photolithography. The electrode materials themselves can also serve to vary the thickness, mass and stiffness of the film as desired in the previous embodiment.

In a specific embodiment of foam biasing, the voids and individual contact points of the foam effectively create individual polymer active areas that are much smaller than the overall polymer area. Since the foam is volumetrically uneven and inconsistent, these smaller film areas will have a variety of sizes. The fundamental resonance frequency of a film element decreases with its area, and higher-order resonances change correspondingly. If the foam is then made to be intentionally more uneven, with an uneven and inconsistent distribution of area and void sizes, the resonant behavior of each active area has proportionately less influence on the overall speaker response. It is thus possible to smooth the overall response at both low and high frequencies, which is desirable.

Foam attached to the polymer may also be made more uneven by a molding process, tearing, cutting or other means. The unevenness may be random or a specific pattern chosen to ensure a wide variety of mode shapes over the desired range of frequencies. The foam could also have a greater range of voids, especially larger voids. Computer modeling, analytical methods or experimentation may also be used to select a desired pattern or size distribution.

In another specific multi-modal embodiment, where an air pressure bias is used, the creation of a greater range of resonant and ant resonant modes, and the consequent smoothing of the frequency response, is achieved by introducing small changes in thickness, mass and or stiffness of the actuated polymer areas over its surface. These changes can be random over the surface or in a specific pattern designed to excite a large number of modes over the desired frequency range.

Thickness or stiffness variations that allow multi-modal performance in a polymer may also be introduced by a variety of means, such as spraying oil polymers or other materials or molding. While not a requirement, the added material is typically attached external to the electrode-dielectric polymer-electrode structure of the transducer (i.e. not between the electrodes). In some cases, stiffened regions, of a uniform or patterned nature, of the dielectric polymer may be created through the use of chemical treatments.

The present invention relates to sonic or acoustic energy devices which include a compliant polymer having elastic modulus less than about 100 MPa and at least two electrodes in electrical communication with the polymer, wherein the polymer is arranged in a manner whereby a portion of the polymer deflects in response to a change in electric field. The electroactive film or diaphragm is selectively mechanically biased in order to facilitate deflection of the polymer in a desired direction, thereby also controlling the directivity of the sonic energy. Such biasing may also play a part in defining the shape of a diaphragm in order to further control directivity of the sonic energy. The shape of the device's diaphragm may have any suitable shape (both in profile and area dimensions) to selectively direct the sonic energy and/or to conform to the structure on which it is disposed. Such shapes include but are not limited to convex and concave where the profile provided is hemispherical or frustum.

In certain embodiments, as perceived by the user, the sonic energy device produces sound. The sonic energy devices may also include an electric driver circuit that is configured to electrically communicate with the at least two electrodes and to actuate the compliant polymer at a sonic frequency. The sonic energy devices may further include a support structure.

In other embodiments, the sonic energy device, as perceived by the user, is a sound reduction device configured to reduce or cancel noise from another source.

In Active Noise Cancellation (ANC) applications, if the noise-generating surface is not flat, the flexibility of polymers described herein provide an ANC device that can conform to the surface contour. The device's compliant polymer is sufficiently flexible to assume a shape of a surface on which it is operatively disposed. In the context of a sound reduction device, the diaphragm is well suited for use in cars, airplanes and other moving vehicles which are subject to engine noise and noise caused by their motion. In these applications, the polymer may be custom shaped to dimensions of a larger object or surface in the vehicle. For example, the polymer may be shaped and attached to a panel or dashboard surface, which allows the sound reduction device to occupy a large surface area that directly interfaces with the surrounding environment, but minimizes the visibility and volume of the sound reduction device. ANC loudspeakers for machine or structure noise may be attached to the sides, top or bottom of the structures, as appropriate. For cabin quieting, the speakers might be flush with the wall surface or integrated in a similarly unobtrusive manner.

A sonic actuator described herein may also be a component of a device containing one or more fans, where the sonic actuator is configured to tune, optimize, minimize or neutralize the sound waves emitted by the fan. The sonic actuator may also be a component of industrial machinery such as mining and earthmoving equipment, factory automation equipment, robotics, food processing equipment, or any other piece of equipment where an attached or integrated sonic actuator has the capability to tune, optimize, minimize or neutralize the sound waves emitted by that piece of equipment. Other applications suitable for use with devices described herein are provided in U.S. Pat. No. 6,343,129, which was incorporated by reference above.

The exact geometry of a given sonic energy device may be tailored for specific applications. For example, a sonic energy device used for ANC in an airplane may be tuned to match one or more primary sources of noise generation, such as the engines, noise from wind resistance, and noise from the air circulation system. These noise sources generally have their peak frequencies in a limited portion of the audio spectrum, so a sonic energy device configured with a bias position to operate in the same portion of the audio spectrum may be implemented. The resonance frequency of the device may be tuned to match that of the loudest or most obtrusive noise source. Similarly, an ANC sonic energy device for an automobile is designed to target primary noise sources for an automobile, such as the engine noise, noise from wind resistance, and noise from the tires. Additionally, arrays, groups or systems of sonic devices may be designed such that a portion of the sonic devices are optimized for one primary noise source, another portion is optimized for a another noise source, and so on. For example, in an automobile, ANC devices in the dashboard may be optimized to reduce engine noise, ANC devices near the floor may be optimized to reduce tire noise, ANC devices in the roof may be optimized to reduce noise from wind resistance, and so on.

For audio applications, such as home theater systems, the sonic energy devices may be tuned for their desired frequency range and enclosures. For example, a sonic energy device designed as a high frequency “tweeter” speaker would likely have a different design from a mid-range speaker or a low-range “woofer” speaker.

Thus, sonic devices of the present invention may be used for sound production and/or reduction. Some devices can be configured with electrical drivers for both. In both cases the ability to build electroactive polymer speakers in different form factors is beneficial. The speakers can be small and compact, or, if surface area is available, one can make large-area speakers that act as distributed secondary sources. Increasing surface area is a way to compensate for less efficient sound radiation at very low frequencies, especially in ANC applications. This mechanical approach (selecting speaker shape) along with adjustments to the electrical and system design aspects (e.g., phased-array beam-forming) of a speaker, allow a user to optimize or customize the speaker's performance.

When tuning a sonic energy device, parameters that affect tuning include the geometry and mass of the sonic energy device, as well as how it is physically attached to the supporting structure. These parameters affect the natural resonance modes of the sonic energy device. For example, geometry changes which are likely to affect the resonance characteristics include the diameters and shape of the inner and outer edges of the diaphragm configuration and how much the cap is biased out of plane. Similarly, the mass may be tuned by the number of layers of EPAM™ material, the material type, design, and thickness of each EPAM™ layer, and the material and geometry of the cap. The manner of the physical attachment of the sonic energy device to the supporting structure may also affect the net sonic output, as a device rigidly connected to the supporting structure would resonate differently than one compliantly connected, using a rubber spacer pad, for instance.

Another factor affecting the manufacture and operation of the sonic energy device includes the material, design, and manufacturing method of the bias element. For instance, in some applications, it may be advantageous to have a concave diaphragm speaker. While this has been achieved via pulling a vacuum on a plenum behind an EPAM™ diaphragm element, such an approach may not be practical for some applications for a variety of reasons. Another method to achieve a similarly concave shape would be to coat a concave foam surface with an adhesive, and pull a vacuum in a manufacturing fixture, drawing the EPAM™ diaphragm element onto the adhesive-coated foam surface. Depending on the shape of the foam surface, e.g., flat, concave, rippled, etc, different shapes of the EPAM™ diaphragm layer could be achieved.

Another method to achieve a concave surface without the use of vacuum would be to sandwich a compression spring between a diaphragm cap (see FIG. 5B) and a supporting structure, possibly in the shape of an ‘X’ or a perforated disc, across the front of the diaphragm. Such geometry would allow for the passage of sound waves, yet also is simple, robust and economical. The resonant frequency of the bias element will affect the overall resonance frequency of the speaker. For this and other reasons, the same bias element type and design may not be beneficial in all applications. For example, the compression spring bias element just described may work better for a low-frequency “woofer” than for high-frequency noise cancellation over large surfaces, where lighter-weight and more economical foam biasing may be the bias element of choice.

In addition to being lighter weight than arrays of conventional speakers in ANC applications, arrays of electroactive polymer actuators may also be more efficient. Since electroactive polymer technology is inherently energy efficient due to its capacitor-based design, ANC applications using electroactive polymer technology are able to recapture a portion of the unused energy on each cycle and reuse it for the next cycle. As a result of this efficiency, the supporting infrastructure (e.g., wiring and power supplies) to supply signals and power to arrays of electroactive polymer ANC components can be both lighter weight and more cost effective than designs using conventional electromagnetic actuators.

Methods associated with the subject devices are contemplated in which those methods are carried out with the subject sonic devices. The methods may comprise the act of providing a suitable speaker, device, transducer, actuator, etc. Such provision may be performed by the end user. In other words, the “providing” merely requires the end user obtain, access, approach, position, set-up, activate, power-up or otherwise act to provide the requisite device in the subject method. The methods also include biasing the polymer or a portion thereof to a bias position, and then actuating the portion.

Yet another aspect of the invention includes kits having any combination of devices described herein—whether provided in packaged combination or assembled by a technician for operating use, instructions for use, etc. A kit may include any number of transducers/actuators/devices/speakers according to the present invention. A kit may include various other components for use with the transducers including mechanical or electrical connectors, power supplies, etc. The subject kits may also include written instructions for use of the devices or their assembly.

As for other details of the present invention, materials and alternate related configurations may be employed as within the level of those with skill in the relevant art. The same may hold true with respect to method-based aspects of the invention in terms of additional acts as commonly or logically employed. In addition, though the invention has been described in reference to several examples, optionally incorporating various features, the invention is not to be limited to that which is described or indicated as contemplated with respect to each variation of the invention. Various changes may be made to the invention described and equivalents (whether recited herein or not included for the sake of some brevity) may be substituted without departing from the true spirit and scope of the invention. Any number of the individual parts or subassemblies shown may be integrated in their design. Such changes or others may be undertaken or guided by the principles of design for assembly.

Also, it is contemplated that any optional feature of the inventive variations described may be set forth and claimed independently, or in combination with any one or more of the features described herein. Reference to a singular item, includes the possibility that there are plural of the same items present. More specifically, as used herein and in the appended claims, the singular forms "a," "an," "said," and "the" include plural referents unless specifically stated otherwise. In other words, use of the articles allow for "at least one" of the subject item in the description above as well as the claims below. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Without the use of such exclusive terminology, the term "comprising" in the claims shall allow for the inclusion of any additional element—irrespective of whether a given number of elements are enumerated in the claim, or the addition of a feature could be regarded as transforming the nature of an element set forth in the claims. Stated otherwise, unless specifically defined herein, all technical and scientific terms used herein are to be given as broad a commonly understood meaning as possible while maintaining claim validity.

We claim:

1. A sonic device comprising:

an electroactive polymer transducer including a portion of an electroactive polymer and a first electrode in contact with the portion and a second electrode in contact with the portion, wherein the electroactive polymer transducer is arranged in a manner which causes the portion to deflect in response to a change in electric field that is applied via at least one of the first electrode and the second electrode, and wherein the electroactive polymer has an elastic modulus less than about 100 MPa;

and a circuit in electrical communication with the first electrode and the second electrode and configured to provide an actuation signal to the at least one of the first electrode and second electrode, wherein the actuation signal causes the electroactive polymer transducer to deflect at a frequency less than about 50 kHz.

2. The sonic device of claim 1 further comprising a biasing mechanism that is configured to position the portion of the electroactive polymer in a bias position from which the portion deflects.

3. The sonic device of claim 1 wherein the electroactive polymer transducer includes a) a planar shape when a biasing mechanism does not position the portion in a bias position and b) a non-planar shape when the portion is in the bias position.

4. The sonic device of claim 1 wherein a biasing mechanism includes a second electroactive polymer transducer, including a second electroactive polymer and at least two electrodes coupled to the second electroactive polymer.

5. The sonic device of claim 1 wherein the electroactive polymer is an elastomeric dielectric polymer.

6. A sonic device comprising:

an electroactive polymer transducer including a portion of an electroactive polymer and a first electrode in contact with the portion and a second electrode in contact with the portion, wherein the electroactive polymer transducer is arranged in a manner which causes the portion to deflect in response to a change in electric field that is applied via at least one of the first electrode and the second electrode, and wherein the electroactive polymer has an elastic modulus less than about 100 MPa:

and a circuit in electrical communication with the first electrode and the second electrode and configured to provide an actuation signal to the at least one of the first electrode and second electrode, wherein the actuation signal causes the electroactive polymer transducer to deflect at a frequency less than about 50 kHz, and wherein a portion of the electroactive polymer is capable of a planar strain of greater than 25% between a first position of the portion with a first area and a second position of the portion with a second area.

* * * * *